(12) United States Patent
Gupta

(10) Patent No.: US 9,778,050 B2
(45) Date of Patent: Oct. 3, 2017

(54) METHOD AND APPARATUS FOR PROVIDING BATTERY MANAGEMENT IN ROUTE NAVIGATION

(71) Applicant: HERE Global B.V., Veldhoven (NL)

(72) Inventor: Amit Kumar Gupta, Billerica, MA (US)

(73) Assignee: HERE Global B.V., Veldhoven (NL)

( * ) Notice: Subject to any disclaimer, the term of this patent is extended or adjusted under 35 U.S.C. 154(b) by 65 days.

(21) Appl. No.: 14/567,621

(22) Filed: Dec. 11, 2014

(65) Prior Publication Data
US 2016/0169692 A1    Jun. 16, 2016

(51) Int. Cl.
| G01C 21/34 | (2006.01) |
| G01C 21/36 | (2006.01) |
| B60W 10/08 | (2006.01) |
| G06F 1/32 | (2006.01) |
| G01R 31/36 | (2006.01) |

(52) U.S. Cl.
CPC ......... *G01C 21/3415* (2013.01); *B60W 10/08* (2013.01); *G01C 21/3469* (2013.01); *G01C 21/3697* (2013.01); *G01R 31/3689* (2013.01); *G06F 1/329* (2013.01)

(58) Field of Classification Search
CPC ............ G01C 21/3415; G01C 21/3469; G01C 21/3697; B60W 10/08; G06F 1/329; G01R 31/3689

USPC ......................................................... 701/521
See application file for complete search history.

(56) References Cited

U.S. PATENT DOCUMENTS

| 8,224,596 B2 | 7/2012 | Agrawal et al. | |
| 2011/0050503 A1* | 3/2011 | Fong | G01C 21/26 342/451 |
| 2011/0257879 A1* | 10/2011 | Ishibashi | G01C 21/3469 701/533 |
| 2013/0282472 A1 | 10/2013 | Penilla et al. | |

* cited by examiner

*Primary Examiner* — Yazan Soofi
(74) *Attorney, Agent, or Firm* — Ditthavong & Steiner, P.C.

(57) ABSTRACT

An approach is provided for battery management in route navigation. A battery management module determines a request to calculate at least one navigation route. The battery module then determines battery charging information associated with presenting guidance information via at least one application of at least one device during the at least one navigation route. Further, the battery management module causes, at least in part, a presentation of the battery charging information on at least one user interface of the at least one device. In one embodiment, the charging information can be updated based on selecting one or more segments of the at least one navigation route to hibernate. In yet another embodiment, alternative content that is less battery intensive can be presented during the hibernated segments in place of active navigation information.

20 Claims, 12 Drawing Sheets

METHOD AND APPARATUS FOR PROVIDING BATTERY MANAGEMENT IN ROUTE NAVIGATION

BACKGROUND

Service providers (e.g., wireless, cellular, etc.) and device manufacturers are continually challenged to deliver value and convenience to consumers by, for example, providing compelling network services. One area of development has been in providing applications and services for route navigation on mobile devices, leading to increased use of mobile-based route navigation. However, use of such routing applications and services can also greatly increase power consumption, particularly on mobile devices (e.g., mobile phones, tablets, etc.). Accordingly, service providers and device manufactures face significant technical challenges to providing route navigation while making efficient use of battery or power resources available on mobile devices.

SOME EXAMPLE EMBODIMENTS

Therefore, there is a need for providing battery management in route navigation.

According to one embodiment, a method comprises determining a request to calculate at least one navigation route. The method also comprises determining battery charging information associated with presenting guidance information via at least one application of at least one device during the at least one navigation route. The method further comprises causing, at least in part, a presentation of the battery charging information on at least one user interface of the at least one device.

According to another embodiment, an apparatus comprises at least one processor, and at least one memory including computer program code for one or more computer programs, the at least one memory and the computer program code configured to, with the at least one processor, cause, at least in part, the apparatus to determine a request to calculate at least one navigation route. The apparatus is also caused to determine battery charging information associated with presenting guidance information via at least one application of at least one device during the at least one navigation route. The apparatus is further caused to present the battery charging information on at least one user interface of the at least one device.

According to another embodiment, a computer-readable storage medium carrying one or more sequences of one or more instructions which, when executed by one or more processors, cause, at least in part, an apparatus to determine a request to calculate at least one navigation route. The apparatus is also caused to determine battery charging information associated with presenting guidance information via at least one application of at least one device during the at least one navigation route. The apparatus is further caused to present the battery charging information on at least one user interface of the at least one device.

According to another embodiment, an apparatus comprises means determining a request to calculate at least one navigation route. The apparatus also comprises means for determining battery charging information associated with presenting guidance information via at least one application of at least one device during the at least one navigation route. The apparatus further comprises means for causing, at least in part, a presentation of the battery charging information on at least one user interface of the at least one device.

In addition, for various example embodiments of the invention, the following is applicable: a method comprising facilitating a processing of and/or processing (1) data and/or (2) information and/or (3) at least one signal, the (1) data and/or (2) information and/or (3) at least one signal based, at least in part, on (including derived at least in part from) any one or any combination of methods (or processes) disclosed in this application as relevant to any embodiment of the invention.

For various example embodiments of the invention, the following is also applicable: a method comprising facilitating access to at least one interface configured to allow access to at least one service, the at least one service configured to perform any one or any combination of network or service provider methods (or processes) disclosed in this application.

For various example embodiments of the invention, the following is also applicable: a method comprising facilitating creating and/or facilitating modifying (1) at least one device user interface element and/or (2) at least one device user interface functionality, the (1) at least one device user interface element and/or (2) at least one device user interface functionality based, at least in part, on data and/or information resulting from one or any combination of methods or processes disclosed in this application as relevant to any embodiment of the invention, and/or at least one signal resulting from one or any combination of methods (or processes) disclosed in this application as relevant to any embodiment of the invention.

For various example embodiments of the invention, the following is also applicable: a method comprising creating and/or modifying (1) at least one device user interface element and/or (2) at least one device user interface functionality, the (1) at least one device user interface element and/or (2) at least one device user interface functionality based at least in part on data and/or information resulting from one or any combination of methods (or processes) disclosed in this application as relevant to any embodiment of the invention, and/or at least one signal resulting from one or any combination of methods (or processes) disclosed in this application as relevant to any embodiment of the invention.

In various example embodiments, the methods (or processes) can be accomplished on the service provider side or on the mobile device side or in any shared way between service provider and mobile device with actions being performed on both sides.

For various example embodiments, the following is applicable: An apparatus comprising means for performing a method of any of the filed claims.

Still other aspects, features, and advantages of the invention are readily apparent from the following detailed description, simply by illustrating a number of particular embodiments and implementations, including the best mode contemplated for carrying out the invention. The invention is also capable of other and different embodiments, and its several details can be modified in various obvious respects, all without departing from the spirit and scope of the invention. Accordingly, the drawings and description are to be regarded as illustrative in nature, and not as restrictive.

BRIEF DESCRIPTION OF THE DRAWINGS

The embodiments of the invention are illustrated by way of example, and not by way of limitation, in the figures of the accompanying drawings.

DESCRIPTION OF SOME EMBODIMENTS

Examples of a method, apparatus, and computer program for providing battery management in route navigation are disclosed. In the following description, for the purposes of explanation, numerous specific details are set forth in order to provide a thorough understanding of the embodiments of the invention. It is apparent, however, to one skilled in the art that the embodiments of the invention may be practiced without these specific details or with an equivalent arrangement. In other instances, well-known structures and devices are shown in block diagram form in order to avoid unnecessarily obscuring the embodiments of the invention.

Figure 1:
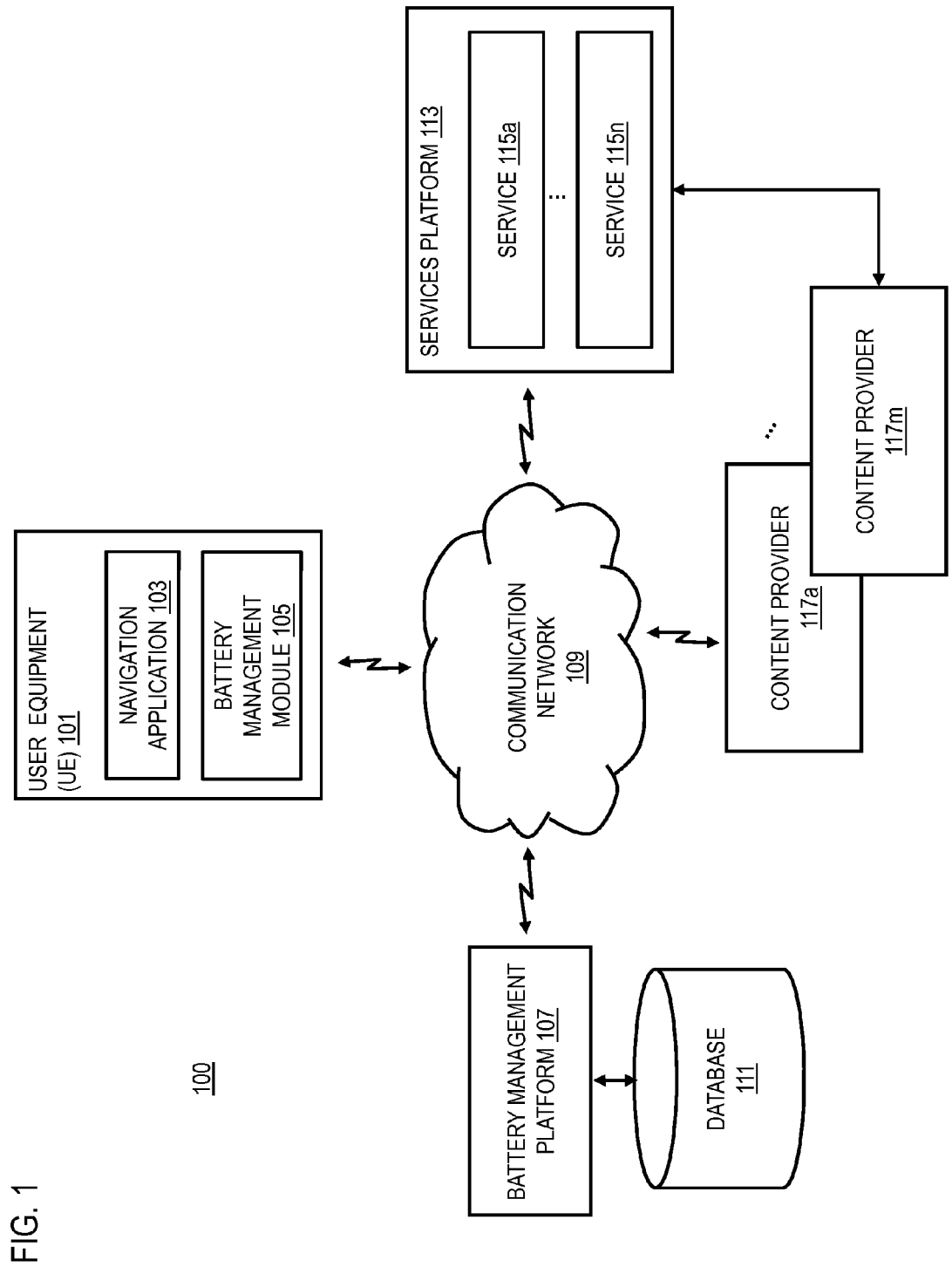
FIG. 1 is a diagram of a system capable of providing battery management in route navigation, according to one embodiment.

FIG. 1 is a diagram of a system capable of providing privacy policy generation based on in-game behavior data, according to one embodiment. As previously, the growing use of navigation applications and/or services on mobile devices have generally made end users more aware of the significant power drains that such navigation applications and/or services can impose on devices. In some cases, the battery charging rate can be lower that the power consumption rate for a mobile device during navigation. As a result, this can lead the device depleting its battery even if the device is plugged in and charging. If the device is operating in battery only mode, the impacts of executing navigation applications and/or services on device battery depletion potentially can be even more significant.

To address this problem, a system 100 of FIG. 1 introduces the capability to calculate battery charging information (e.g., how many times or cycle a battery needs to be recharged, a length of time a battery needs to be charged, etc.) to enable a device to provide navigation for a duration of a navigation route. In one embodiment, the system 100 also enables a user to manually select or automatically determine a subset (e.g., one or more segments) of the navigation route to activate or de-active a reduced power consumption mode of operation for the selected subset or segments. In one embodiment, during the reduced power consumption mode of operation, the system 100 can present alternative content (e.g., content related to the route or points of interest along the route that does consume as much battery power as traditional navigation content). By way of example, such alternative content can include offers, marketing information, advertisements, sponsored content, travel guides (e.g., voice and/or visual travel guides, information about the route and/or nearby points of interest, etc. In some embodiments, the system 100 can process contextual information (e.g., location, time of day, season, etc.) to determine and present the alternative content most likely to be relevant to a user. In this way, the system 100 can present potentially relevant information that would be less battery intensive during travel segments where active navigation may otherwise be unneeded or unwanted by the user.

The system 100 can then, for instance, recalculate and present the battery charging information for the navigation route based on the selection of the route segments. The ability to selectively activate or deactivate (e.g., hibernate) certain navigation route segments so that less battery power is used for those segments advantageously enables a mobile device to extend its limited power resources.

By way of example, a user can deactivate or hibernate certain route segments that are already familiar to the user, so that navigation guidance is not necessary or needed by the user. In another example, the system 100 itself can automatically deactivate or hibernate a route segment based on contextual information (e.g., that GPS signal is poor or non-existent for certain segments) or other factors (e.g., user history, user preference, etc.). It is noted that these examples are provided by way of illustration and not limitation. Thus, it is contemplated that the manual or automatic selection of segments can be made using any criteria or rule specified by the user and/or the system 100. In one embodiment, the capability to hibernate or activate certain route segments recognizes that under certain circumstances route navigation for a given segment may not be necessary, and reducing power consumption during those segments provides for more efficient battery management.

In one embodiment, when route segments are selected for hibernation or routing, the system 100 enables the mobile device to transition from active to in-active segments without user interaction. For example, the system 100 automatically resumes a navigation application following an inactive segment so that the user does not have to manually exit or restart the navigation application or service to resume from a hibernated state. In another embodiment, the system 100 further enables resumption from a hibernated state without initiating a route recalculation on entering an active segment. Instead, the system 100 treats the entire navigation route with both active and inactive segments as one unified and planned route, and not as discrete segments that interrupt a planned navigation route.

In one embodiment, the transition from an active segment to an inactive segment or vice versa can be initiated by one or more triggering events that are associated with the segments. In one embodiment, the triggering events are associated with specific segments or locations with the segments using triggering criteria. The triggering events, for instance, service as points along the segments or navigation route that will trigger a specific navigation related action such as activating or hibernating a given route segment. It is contemplated that the triggering events can also initiate any other action of the navigation application/service or the mobile device.

As shown in FIG. 1, in one embodiment, the system 100 includes a user equipment (UE) 101 (e.g., a mobile device with battery power), which may be utilized to execute a navigation application 103 (or other application that can provide routing information such as social networking applications, games, web browsers, media applications, etc.). In one embodiment, the UE 101 also includes a battery management module 105 for performing one or more functions of the various approaches to providing battery management in route navigation as described herein. Although the battery management module 105 is depicted as a separate component of the UE 101, it is contemplated that battery management module 105 or at least some of its functions can be incorporated in or performed by the navigation application 103.

In one embodiment, the UE 101 may have connectivity to a battery management platform 107 over the communication network 109. The battery management platform 107 can perform all or a portion of the functions of the battery management module 105 as a network component. In one embodiment, the battery management platform 107 can operate in place of or in conjunction with (e.g., in a client-server architecture) the battery management module 105. In one embodiment, the battery management module 105 may synchronize routing information, segment selections, battery management settings, and/or other information related to providing battery management in route navigation to the battery management platform 107 for storage in, for instance, the database 111. In addition or alternatively, the routing information, segment selection, battery management settings, and/or other related information may be synchronized with and/or restored from the services platform 113, the services 115, the content provider 117, and/or any other cloud component of the system 100. In this way, the battery management platform 107 can share the information with other devices associated with the UE 101 to enable one device (e.g., the UE 101) to set navigation routing and/or battery management for use on one or more other devices.

In one embodiment, the navigation application 103, the battery management module 105, and/or the battery management platform 107 also can communicate with a service platform 113 that includes one or more services 115a-115n (also collectively referred to as services 115), as well as one or more content providers 117a-117n (also collectively referred to as content providers 107) to access services and/or content related to route navigation and/or battery management for route navigation. For example, the services platform 113 may include any type of service 115 associated with the navigation application 103 and/or the battery management module 105/battery management platform 107. The service platform 113 and/or services 115 may also provide data (e.g., contextual data, user history data, user preference data, crowdsourcing date, device capability information, etc.) associated with calculating battery charging information, selecting route segments, associating triggering events, presenting related user interfaces, etc. By way of example, the services platform 113 may include social networking services, content (e.g., audio, video, images, etc.) provisioning services, application services, storage services, contextual information determination services, location based services, information (e.g., weather, news, etc.) based services, etc.

The content providers 117 may provide content to the UE 101, the navigation application 103, the battery management module 105, and/or the battery management platform 107. The content provided may be any type of content, such as mapping content, navigation content, textual content, audio content, video content, image content, etc. In one embodiment, the content providers 117 may also store content associated with the UE 101, the navigation application 103, the battery management module 105, and/or the battery management 107 in a central repository of data (e.g., cloud-based data), and offer a consistent, standard interface to user's data for synchronization or distribution among multiple devices.

In one embodiment, when calculating or customizing (e.g., by hibernating or activating certain route segments) battery charging information for a given navigation route, the system 100 may configure the battery management module 105/battery management platform 107 to operate in different ways (note that in the description provided herein, references to battery management module 105 are also applicable to the battery management platform 107). For example, in a first way of operating, the battery management module 105 may be provided with a navigation route. The battery management module 105 then calculates the battery charging information (e.g., a number times a device battery will have to be recharged for traveling the navigation route) based on this provided route.

In a second example way of operating, the battery management module 105 can be provided with desired charging information (e.g., a desired number of charging cycles, a desired charging time, etc.), then the battery management module 105 can calculate or recommend segments in the navigation route to select for hibernation or de-activation. In addition or alternatively, the battery management module 105 can present a user interface for manual selection of which route segments to activate or hibernate. In another embodiment, the user interface can present differentiated renderings for active versus hibernated segments to provide the user with a quick visual indicator of when to expect normal navigation routing versus a reduced power consumption mode for routing.

In one embodiment, the system 100 enables triggering events to be associated with specific triggering locations on the navigation route. In one embodiment, the triggering events causes the navigation application 103 to activate or deactivate a hibernation or reduced power consumption mode. In this way, the system 100 provides the user with an ability to maintain a navigation route with active and hibernated segments without the user having to manually reopen or restart the navigation application 103 or an active state of the navigation application 103, or the navigation application 103 having to recalculate the navigation route after exiting a hibernated segment. By way of example, the triggering events can include, but are not limited to, odometer readings, estimated time of arrival at a triggering location, toll payments (e.g., near-field communication (NFC) or other short range wireless based payment), recognition of nearby points-of-interest along a segment, exits, wireless beacons, etc.).

In addition or alternatively, the triggering events can also be configured to initiate any other action (e.g., an action by the UE 101, the navigation application 103, the battery management module 105, etc.). For example, other actions can include activating and/or deactivating different sensors (e.g., location sensors) of the UE 101. In one embodiment, the system 100 can recommend triggering locations so that triggering events can occur when entering or exiting one segment to another segment of the navigation route. In another embodiment, the system 100 enables searching for candidate triggering events and associated locations that are present along the segments to enable manual or automatic selection of triggering events for the particular segment.

In yet another embodiment, once the triggering events are associated, the system 100 monitors and compares the location of the device 101 against the triggering events to initiate any associated actions. By way of example, the monitoring may be performed using any sensor available to the UE 101 (e.g., an odometer, a microphone, a camera, an accelerometer, GPS receiver, a magnetometer, NFC reader, wireless receiver, etc.) that can be used to determine positioning information. In one embodiment, the choice of which sensor (if any) to use can depend on the configuration of the reduced power consumption mode. For example, lower power sensors (e.g., an odometer) can be used instead of higher power sensors (e.g., GPS receiver) when operating in hibernated or reduced power consumption mode route segments.

By way of example, the communication network 109 of system 100 includes one or more networks such as a data network, a wireless network, a telephony network, or any combination thereof. It is contemplated that the data network may be any local area network (LAN), metropolitan area network (MAN), wide area network (WAN), a public data network (e.g., the Internet), short range wireless network, or any other suitable packet-switched network, such as a commercially owned, proprietary packet-switched network, e.g., a proprietary cable or fiber-optic network, and the like, or any combination thereof. In addition, the wireless network may be, for example, a cellular network and may employ various technologies including enhanced data rates for global evolution (EDGE), general packet radio service (GPRS), global system for mobile communications (GSM), Internet protocol multimedia subsystem (IMS), universal mobile telecommunications system (UMTS), etc., as well as any other suitable wireless medium, e.g., worldwide interoperability for microwave access (WiMAX), Long Term Evolution (LTE) networks, code division multiple access (CDMA), wideband code division multiple access (WCDMA), wireless fidelity (WiFi), wireless LAN (WLAN), Bluetooth®, Internet Protocol (IP) data casting, satellite, mobile ad-hoc network (MANET), and the like, or any combination thereof.

The UE 101 may be any type of mobile terminal, fixed terminal, or portable terminal including a mobile handset, station, unit, device, multimedia computer, multimedia tablet, Internet node, communicator, desktop computer, laptop computer, notebook computer, netbook computer, tablet computer, personal communication system (PCS) device, personal navigation device, personal digital assistants (PDAs), audio/video player, digital camera/camcorder, positioning device, television receiver, radio broadcast receiver, electronic book device, game device, or any combination thereof, including the accessories and peripherals of these devices, or any combination thereof. It is also contemplated that the UE 101 can support any type of interface to the user (such as "wearable" circuitry, etc.). Further, the UE 101 may include various sensors for collecting data associated with route navigation, a user, and/or a user's environment. For example, the sensors may determine and/or capture audio, video, images, atmospheric conditions, device location, user mood, ambient lighting, user physiological information, device movement speed and direction, and the like.

By way of example, the UE 101, the navigation application 103, the battery management module 105, and the battery management platform 107 may communicate with each other and other components of the system 100 using well known, new or still developing protocols. In this context, a protocol includes a set of rules defining how the network nodes within the communication network 115 interact with each other based on information sent over the communication links. The protocols are effective at different layers of operation within each node, from generating and receiving physical signals of various types, to selecting a link for transferring those signals, to the format of information indicated by those signals, to identifying which software application executing on a computer system sends or receives the information. The conceptually different layers of protocols for exchanging information over a network are described in the Open Systems Interconnection (OSI) Reference Model.

Communications between the network nodes are typically effected by exchanging discrete packets of data. Each packet typically comprises (1) header information associated with a particular protocol, and (2) payload information that follows the header information and contains information that may be processed independently of that particular protocol. In some protocols, the packet includes (3) trailer information following the payload and indicating the end of the payload information. The header includes information such as the source of the packet, its destination, the length of the payload, and other properties used by the protocol. Often, the data in the payload for the particular protocol includes a header and payload for a different protocol associated with a different, higher layer of the OSI Reference Model. The header for a particular protocol typically indicates a type for the next protocol contained in its payload. The higher layer protocol is said to be encapsulated in the lower layer protocol. The headers included in a packet traversing multiple heterogeneous networks, such as the Internet, typically include a physical (layer 1) header, a data-link (layer 2) header, an internetwork (layer 3) header and a transport (layer 4) header, and various application (layer 5, layer 6 and layer 7) headers as defined by the OSI Reference Model.

In one embodiment, one or more entities of the system 100 may interact according to a client-server model with the applications 103 and/or the DC module 117 of the UE 101. According to the client-server model, a client process sends a message including a request to a server process, and the server process responds by providing a service (e.g., context-based grouping, social networking, etc.). The server process may also return a message with a response to the client process. Often the client process and server process execute on different computer devices, called hosts, and communicate via a network using one or more protocols for network communications. The term "server" is conventionally used to refer to the process that provides the service, or the host computer on which the process operates. Similarly, the term "client" is conventionally used to refer to the process that makes the request, or the host computer on which the process operates. As used herein, the terms "client" and "server" refer to the processes, rather than the host computers, unless otherwise clear from the context. In addition, the process performed by a server can be broken up to run as multiple processes on multiple hosts (sometimes called tiers) for reasons that include reliability, scalability, and redundancy, among others.

Figure 2:
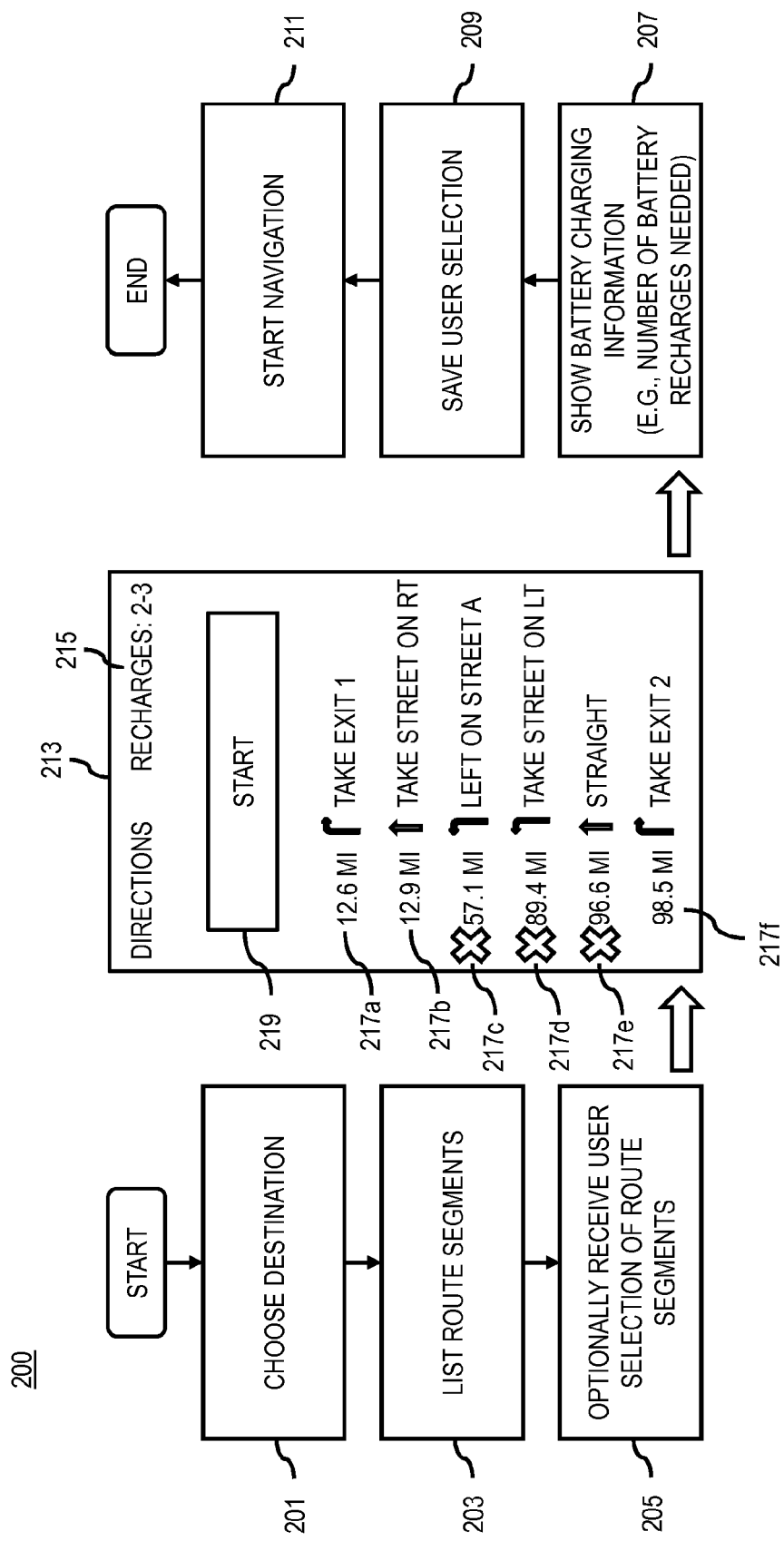
FIG. 2 is a diagram illustrating an example use case for providing battery management in route navigation, according to one embodiment.

FIG. 2 is a diagram illustrating an example use case for providing battery management in route navigation, according to one embodiment. More specifically the example of FIG. 2 demonstrates a workflow for a user of the system 100 to initiate navigation routing, and then to mark segments of the navigation route during which the user will not need navigation guidance. In one embodiment, the navigation application or service (e.g., navigation application 103 will enter a reduced power consumption mode of operation or a hibernation state.

As shown in FIG. 2, workflow 200 (e.g., comprised of steps 201-211) is explained with to an example user interface 213. In step 201, a user interacts with the navigation application 103 to choose a destination. In response, the navigation application 103 calculates a navigation route to the destination from the user's current location (e.g., using any routing engine or algorithm available).

In step 203, after calculating a route for the user, the navigation application 103 can list segments of the route (e.g., in the user interface 213). In one embodiment (as shown), the navigation application 103 determines segments of the navigation route using points or locations where navigation maneuvers are to be performed (e.g., turning, exiting, traversing, etc.). However, it is contemplated that the navigation application 103 can use any means to segment a navigation route. For example, the navigation application 103 may segment a route based on distance, terrain features, points-of-interest, triggering points, and/or any other feature or location of the navigation route.

In step 205, the navigation application 103 can optionally receive a user selection of route segments that are to be hibernated or for which the user does not need navigation guidance information to be presented by the navigation application 103. In one embodiment, to aid user selection, the navigation application 103 presents the user interface 213 which shows the calculated navigation route. In addition, the user interface 213 shows the estimated battery charging information 215 associated with the navigation route (step 207). The battery charging information 215, for instance, represents an estimate of how many recharge cycles of the batteries of the device (e.g., the UE 101) executing the navigation application 103 will consume during the navigation route. In this example, the estimated number of recharges is two to three recharges to complete the 98.5 mile trip. In one embodiment, the battery charging information 215 is determined or calculated by the battery management module 105.

The user interface 213 also lists the segments 217a-217f (also collectively referred to as segments 217) of the navigation route. In one embodiment, the user selects or deselects one or more of the segments 217 for activation of a reduced power consumption mode (e.g., hibernation) of the navigation application 203 during the selected segment. As shown in the example of FIG. 2, the user interface 213 indicates (e.g., with an "X") that the user has selected segments 217c-217e for activation of the reduced power consumption mode, while keeping segments 217a, 217b, and 217f active. In one embodiment, the battery charging information 215 displayed in the user interface 213 is dynamically updated to reflect the user selection. In this case, the estimated 2-3 recharges needed for the navigation route is based on the power consumption needed with segments 217c-217e. If the user were to select fewer or more segments for hibernation, the battery charging information 215 would be updated accordingly.

In step 209, the navigation application 103 and/or the battery management module 105 saves the user selection of the segments 217 and provides battery management for the navigation route accordingly on selection of the start option 219 of the user interface 213 (step 211). As previously discussed, on starting the navigation route in battery management mode, the navigation application 103 begins to seamlessly provide navigation information in both active and hibernated segments without the user having to manually restart the application or requiring a route recalculation when transitioning between active and hibernated modes.

Figure 3:
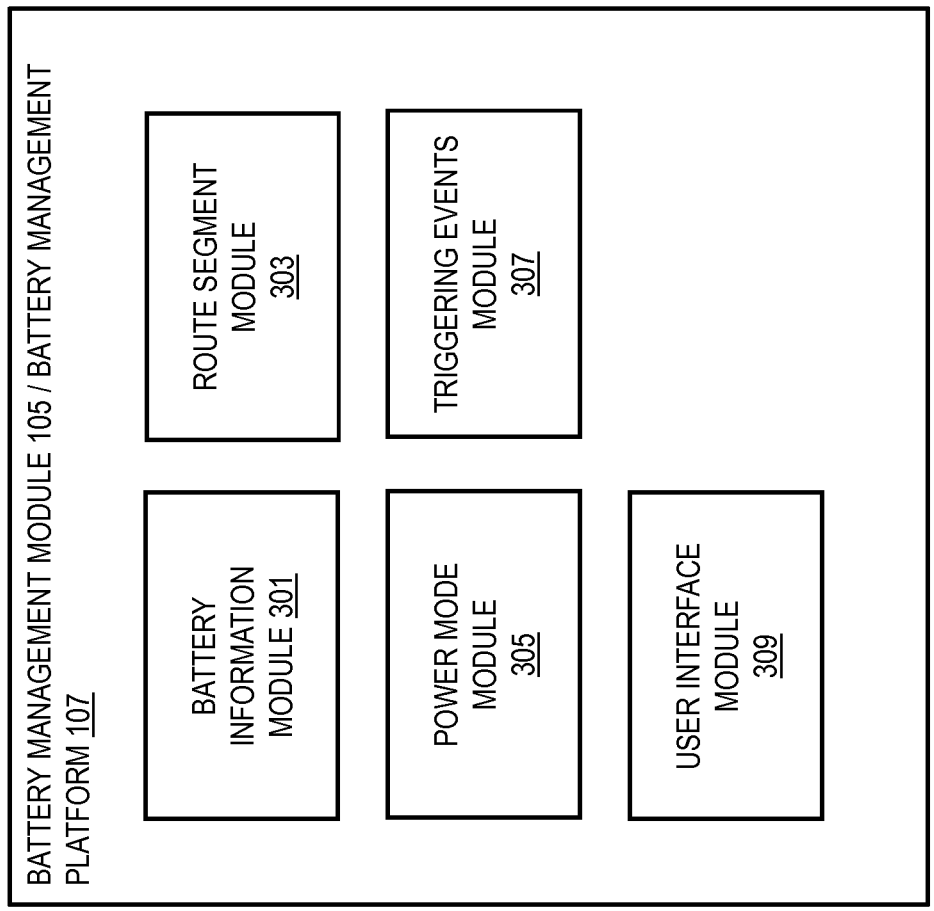
FIG. 3 is a diagram of battery management module/battery management platform, according to one embodiment.

FIG. 3 is a diagram of battery management module/battery management platform, according to one embodiment. By way of example, the battery management 105 and/or the battery management platform 107 include one or more components providing battery management in route navigation. It is contemplated that the functions of these components may be combined in one or more components or performed by other components of equivalent functionality. In one embodiment, the battery management module 105/battery management platform 107 include a battery information module 301, a route selection module 303, a triggering events module 305, and a user interface module 307.

In one embodiment, the battery information module 301 calculates the battery charging information for a given navigation route. By way of example, the battery information module 301 can interact with the navigation application 103 to determine when a user requests a navigation route or when the navigation application 103 has calculated a navigation route for a user. The battery information module 201 then initiates it's calculation of the battery charging information for the navigation route.

In one embodiment, the battery information module 301 considers operational factors associated with executing the navigation application 103 to provide navigation guidance during the route navigation. For example, the operational factors may include, but are not limited to, (1) power consumption related to sensor usage (e.g., GPS receiver usage); (2) power consumption related to rendering of mapping data and/or other user interface elements during route navigation; and (3) power consumption related to use of device resources such as computational resources (e.g., CPU resources), memory resources, input/output resources, etc. associated with providing guidance information during route navigation.

Based, on the battery information module 301's estimation of the power consumption (e.g., based on the resources used above), the battery information module 301 calculates the battery charging information for the navigation route. As previously discussed, the battery information module 301 may represent or express the battery charging information according to any metric. In one embodiment (as shown in the example of FIG. 2), the metric used is number of battery recharge cycles to complete the navigation route. Other metrics or representation for the battery charging information include battery charging time needed, estimated total amount of power (e.g., expressed in ampere-hours), battery depletion locations, distance to battery depletion, and the like.

In one embodiment, the battery information module 301 can interact with the route segment module 303 to select and/or recommend one or more segments of the navigation route to hibernate to conserve available battery power. For example, the route segment module 303 identifies or subdivides the navigation route into segments. As previously discussed, in one embodiment, the segmentation is based on navigation maneuver locations, but it is contemplated that the route segment module 303 can use any means, criteria, or algorithm to segment a given navigation route.

In one embodiment, once the segments are determined, the route segment module 303 can operate in either an automatic (e.g., without user intervention) or a manual mode (e.g., with user intervention). For example, in an automatic mode of operation, the route segment module 303 can recommend or automatically select which segments to hibernate to achieve a desired level of battery performance. In other words, the route segment module 303 can be given a desired number or recharge cycles by a user or the navigation application (or any other battery charging metric), and the route segment module 303 can process information regarding the segment to recommend which segments to hibernate. For example, the route segment module 303 can collect information on the context of the available route segments to determine to make a recommendation or automatic selection. The contextual information may provide information such as which segments have poor or no location signal reception (e.g., location satellite (GPS) signal reception). Other examples of contextual information include familiarity of the segments to the user (e.g., based on historical travel data), a complexity of the segments (e.g., number turns, types of roads, available signage, etc., determined from mapping data or other location databases), etc.

In a manual mode of operation, the route segment module 303 can request input from a user regarding which segments that the user would like to hibernate (e.g., by presenting a segment selection user interface as discussed above). In one embodiment, the route segment module 303 can combine both the automatic mode and the manual mode of operation. For example, the route segment module 303 can present a recommended set of segments to hibernate for manual confirmation by the user, or can provide for a manual override of automatically hibernated segments.

After the selection of the segments to hibernate or to activate, the route segment module 303 interacts with the power mode module 305 to implement one or more battery conservation measures during travel within hibernated segments. Similar to the process described for calculating battery charging information, the power mode module 305 can deactivate various operational factors such as sensors, rendering functions, and device resource use to provide a hibernated or reduced power consumption mode of operation for hibernated segments. For example, the power conservation measures can include replacing active navigation content with alternative content that is less resource intensive (e.g., battery consumption resulting from use of sensors, rendering functions, etc.). For example, in place of a dynamically updated three-dimensional navigation map display, static content can be displayed with information related to the navigation route based, for instance, on contextual information associated with the route, user, location, time of day, season, etc. In this way, the battery management module 105 enables a seamless transition from activation navigation content (e.g., full voice guidance) to less battery intensive but related content (e.g., offers or other related content) and back as the user moves from active to hibernated segments of the route to save battery power.

For example, with respect to sensors, the navigation application 103 and/or the UE 101 executing the navigation application 1103 can determine location information for route navigation using any number of means including, but not limited to a triangulation system such as a satellite-based positioning system (e.g., GPS, GLONASS, etc.), a network assisted positioning system (e.g., A-GPS), Cell of Origin, or other location extrapolation technologies. Standard GPS, GLONASS, and A-GPS systems can use satellites to pinpoint the location of a device. A Cell of Origin system can be used to determine the cellular tower that a cellular UE 101 is synchronized with. This information provides a coarse location of the UE 101 because the cellular tower can have a unique cellular identifier (cell-ID) that can be geographically mapped. Other location-related sensors can use non-triangulation technologies such as odometer readings (e.g., via an ODB II interface to a vehicle's electronic control systems), position sensors (e.g., compass, accelerometers, gyroscopes, barometers, etc.), and the like. Each of these types of sensors have different power consumption requirements with satellite-based location sensors (e.g., GPS receivers) typically requiring more power consumption than the other types of sensors listed. Accordingly, the power mode module 305 can configure to a reduce power consumption mode that, for instance, (1) disables the power-hungry sensors (e.g., the GPS receiver) in a favor of using more power efficient sensors (e.g., odometers, cell-ID, etc.) that potentially offer less accurate positioning information; or (2) disables all location sensors to save battery life. In other words, it is contemplated that the power mode module 305 can configure any, all, or none of the device sensors to be active or inactive based on a desired power consumption rate.

In one embodiment, another potential source of significant power consumption in route navigation is the power needed for rendering the mapping and guidance user interfaces used in route navigation. For example, such user interfaces often present maps (e.g., typically in three dimensions) that are updated at high frame rates to provide smooth animation and tracking for users. Accordingly, in one embodiment, the power mode module 303 can reduce or eliminate the rendering of routing maps and interfaces to provide a reduced power consumption mode. For example, the navigation application 103 can be configured by the power mode module 303 to provide a static user interface or no user interface at when a user is in a hibernated segment of the navigation route. In other embodiments, the power mode module 303 can configure the navigation application 103 to reduce frame rates, reduce the number/complexity of objects to render in the user interface, etc. to implement a reduced power consumption mode for the hibernated segments.

In yet another embodiment, another potential source of power consumption is from the device resources allocated to the navigation application 103 for route navigation. By way of example, such device resources include, but are not limited to, CPU resources, memory resources, network resources (e.g., wireless receivers/transmitters), and the like. Accordingly, in one embodiment, the power mode module 103 can reduce or eliminate the allocation of such resources to the navigation application 103 during hibernated segments.

In one embodiment, because location sensors may be deactivated during a reduced power consumption mode, the triggering events module 307 enables the determination of triggering events that can cause the navigation application 103 to transition from a hibernated state to an active state or vice versa as a user moves from a hibernated segment to an active segment of the navigation route. By way of example, other triggering events can include detection of points of interest (e.g., well-known points of interest such as landmarks, restaurants, shopping malls, toll stations, etc. that can be recognized by the user of the UE 101) near or along the route segments. For example, if a triggering event is arrival at a toll station and the toll station provides for payment using the UE 101 (e.g., the toll station provides for payment via radio frequency identification (RFID), near field communication (NFC) tags, or other similar technologies), the device interaction with the toll station (associated with a known location) is detected by the UE 101 and triggers reactivation of the navigation application 103.

In one embodiment, the triggering events can be associated with odometer readings collected by the UE 101. For example, when calculating a navigation route and its segments, the navigation application 103 can take an odometer reading at the time the route is calculated, and then estimate what the odometer reading should be when reaching the various segments of the route. Then, during route navigation, as the odometer reaching reaches the estimated segment odometer readings, the triggering events module 307 can either activate or deactivate the hibernated or reduced power consumption mode of operation.

In one embodiment, the triggering events module 307 enables the user to search for possible triggering events (e.g., via mapping user interface) to select triggering events and their locations to activate the reduced power consumption mode of operation. In one embodiment, the triggering event or point can be determined or input by the user or based on other non-satellite (e.g., non-GPS) approaches such as cell-ID, WiFi signature, providing the user with a specific odometer reading for the triggering event, providing an expected time of arrival at the triggering point, etc. For example, when the user notices that the user is at or near the triggering odometer reading (e.g., 12000 miles) or the triggering time (e.g., 10:00 AM) or at a specific location determined by cell-ID, the user can cause the navigation application 103 to exit the reduced power consumption mode of operation.

In one embodiment, the triggering events module 307 can interface with an odometer of an associated with vehicle to determine a distance traveled, for example, by a vehicle. In one embodiment, the odometer reading may be actual odometer readings and/or may be such data that the triggering events module 307 may process to determine the odometer information of the vehicle. In one embodiment, distance traveled by a user may be determined from other similar sensors (e.g., a pedometer device associated with the UE 101 or the user). It is contemplated that the triggering events module 307 can interface with any other instrument of an associated vehicle (e.g., speedometer, radar systems, lidar systems, camera systems, etc.) to determine or recognize triggering events.

Figure 4:
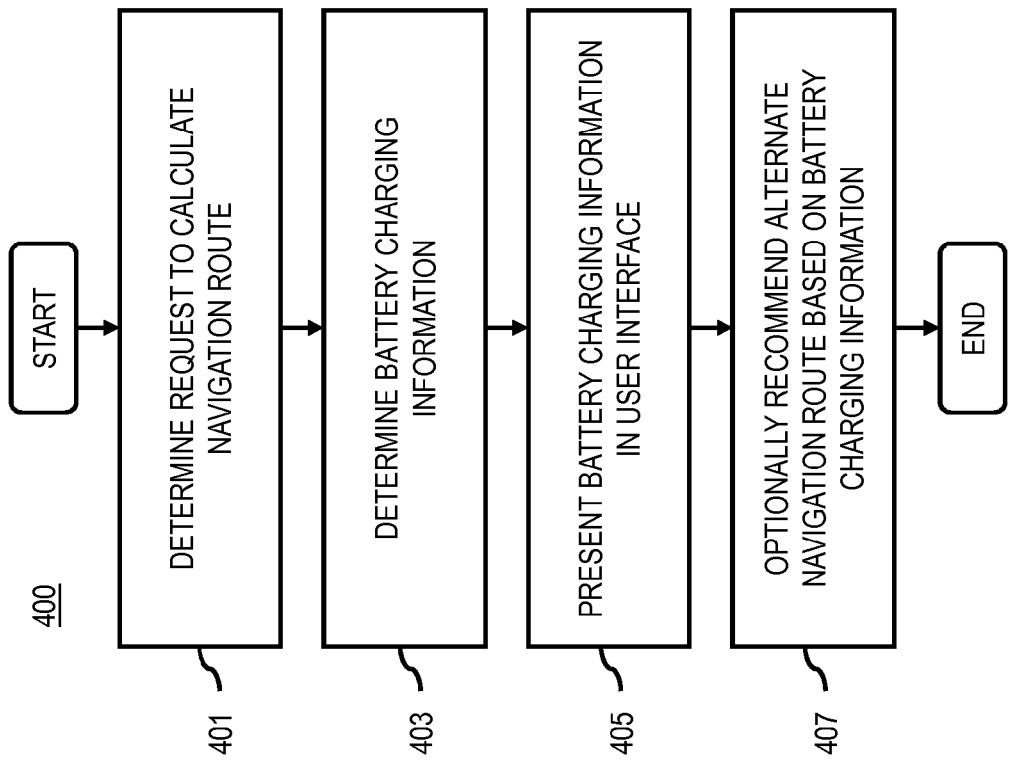
FIG. 4 is a flowchart of process for providing battery management in route navigation, according to one embodiment.
Figure 10:
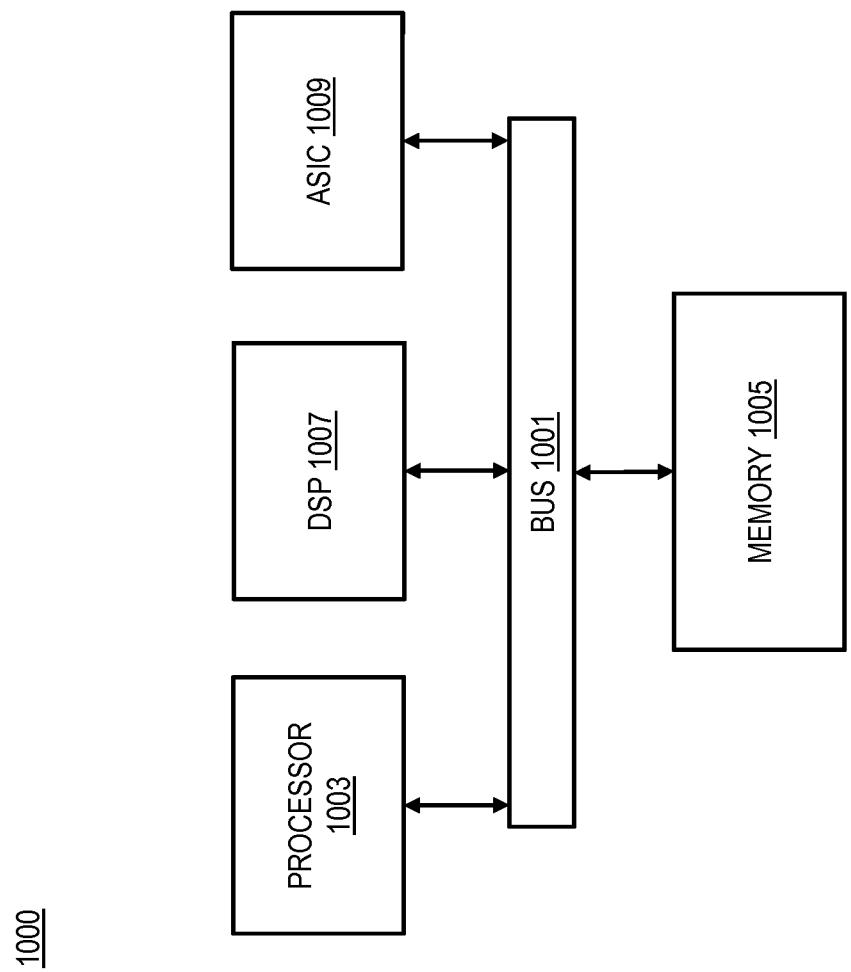
FIG. 10 is a diagram of a chip set that can be used to implement an embodiment of the invention.

FIG. 4 is a flowchart of process for providing battery management in route navigation, according to one embodiment. In one embodiment, the battery management module 105 performs the process 400 and is implemented in, for instance, a chip set including a processor and a memory as shown in FIG. 10. In addition or alternatively, the battery management platform module 107 may perform all or a portion of the process 400, and may also be implemented in the chip set including the processor and the memory as shown in FIG. 10.

In step 401, the battery management module 105 determines a request to calculate at least one navigation route. As previously discussed, in one embodiment, the process for providing battery management begins with a request from a user to calculate a navigation route. By way of example, the request may be received directly from the user or from the navigation application 103. In another embodiment, the battery management module 105 may intercept requests (e.g., between the user and the navigation application 103) for processing according to the various embodiments described herein.

In step 403, the battery management module 105 determines battery charging information associated with presenting guidance information via at least one application of at least one device during the at least one navigation route. In one embodiment, the battery charging information includes, at least part, an estimated number of charging cycles for one or more batteries of the at least one device. The battery management module 105, for instance, can determine the amount of battery consumption associated with the application by querying metadata associated with the application (e.g., when a navigation application 103 reports its battery usage). In other embodiments, the battery management module 105 can log the power consumption of the application over time. In yet other embodiments, the battery management module 103 can evaluate the sensors, rendering characteristics, and/or the resource usage (e.g., CPU, memory, storage, network, etc.) to estimate power consumption and its effects on the battery charging estimates resulting from use of the application.

In one embodiment, the battery management module 105 determines one or more modes of transport associated with the at least one navigation route. In one embodiment, the battery charging information is further based, at least in part, on the one or more modes of transport. For example, the modes of transport used for a particular navigation route can potentially affect the length of the trip or route, and therefore the type amount of time that the navigation application (e.g., the navigation application 103) will be use and drawing power. In one embodiment, the battery management module 105 can determine contextual information about the route, the UE 101, the user, the mode of transport, vehicle, etc. to further refine the estimated battery charging information. For example, contextual information such as weather on the route, condition of the vehicle, etc. can potentially affect the travel time, which in turn affects the estimated power consumption and battery charging information.

In step 405, the battery management module 105 causes, at least in part, a presentation of the battery charging information on at least one user interface of the at least one device. In one embodiment, the user interface is associated with the navigation application 103 providing the route navigation. In addition or alternatively, the battery charging information can be presented in a user interface of another application or service, such as a separate window in a multi-tasking environment, as a widget, as in indicator in a title bar, etc. Moreover, the battery management module 105 can use any representation of the battery charging information (e.g., text, graphic, icons, etc.) for presentation in the user interface. As previously discussed, although the battery charging information is described as the battery management module 105 can also use any metric In step 407, the battery management module 105 optionally determines or recommends one or more alternate navigation routes based, at least in part, on the battery charging information. For example, if the user specifies a number of charge cycles the user would like to use for a given navigation route, the battery management module 105 may select a route that includes enough segments that can be hibernated to enable the navigation route to be completed with the specified number of charging cycles.

Figure 5:
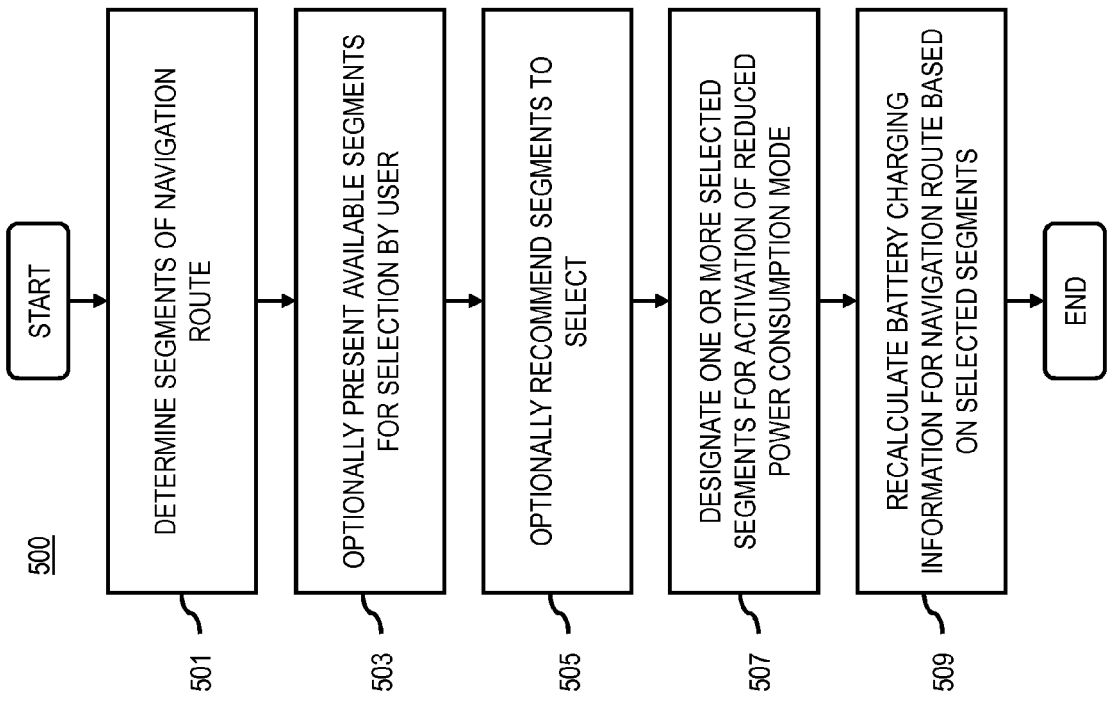
FIG. 5 is a flowchart of a process for determining route segments for providing battery management in route navigation, according to one embodiment.

FIG. 5 is a flowchart of a process for determining route segments for providing battery management in route navigation, according to one embodiment. In one embodiment, the battery management module 105 performs the process 500 and is implemented in, for instance, a chip set including a processor and a memory as shown in FIG. 10. In addition or alternatively, the battery management platform module 107 may perform all or a portion of the process 500, and may also be implemented in the chip set including the processor and the memory as shown in FIG. 10.

In step 501, the battery management module 105 determines one or more selected segments of the at least one navigation route. In one embodiment, determining the selected segments includes determining which of the segments are to be designated for hibernation or activation of the reduced power consumption mode of operation. It is noted that although the various embodiments are discussed with respect to selected segments for hibernation, it is contemplated that in one embodiment, the segments may selected to be active and that the non-selected segments are to be hibernated.

As previously discussed, the process of determine the selected segments can be performed automatically by the battery management module 105 and/or manually by the user. Accordingly, in step 503, the battery management module 105 optionally causes, at least in part, a presentation of one or more available segments of the at least one navigation route. In other words, the battery management module 105 (e.g., via the navigation application 103) can cause a listing of the segments of a navigation route to be presented to the user. The presentation may be in list form, map form, and/or any other form supported by the user interface of the navigation application 103 and/or the battery management module 105. In response to the presentation, the battery management module 105 receives at least one input for selecting the one or more selected segments from the one or more available segments.

In an embodiment where the selection is performed automatically, the battery management module 105 optionally causes, at least in part, a recommendation and/or a selection of the one or more selected segments based, at least in part, on preference information, historical information, contextual information, or a combination thereof (step 505). For example, the user may pre-configure the preference information to indicate criteria, parameters, rules, etc. for selecting the segments. These preferences may, for instance, designate areas or types of areas where the user does not need or prefer to have active route navigation (e.g., near home, near work, etc.). With respect to historical information, the battery management module 105 may process previously calculated or traveled routing data to determine whether specific segments are familiar to a user. In one embodiment, the determination of familiarity can be made if the user has previously traveled a segment above a threshold number of times.

With respect to contextual information, the battery management module 105 may collect any other type of information relevant to determining whether to hibernate a particular segment. For example, the battery management module 105 can determine whether a segment has low complexity (e.g., a low number of intersections, entrances, exits, etc.) such as with a straight highway, or high complexity (e.g., a highway interchange with multiple ramps from multiple intersecting highways). Other examples of contextual information include information regarding areas with documented low location satellite signal penetration (e.g., highly canopied highways, areas with high surrounding terrain or buildings, etc.). In this case, the battery management module 105 can recommend and/or select segments associated with such areas for hibernation because location signals are likely to be unavailable.

After selection of the segments, in step 507, the battery management module 105 causes, at least in part, a designation of the one or more selected segments for an activation of at least one reduced power consumption mode of operation for the at least one application, the at least one device, or a combination thereof while traveling the one or more selected segments. In one embodiment, as previously described, the at least one reduced power consumption mode includes, at least in part, a disabling of one or more sensors, a use of one or more alternate sensors, a disabling of one or more rendering options, a reduction in computational resources, or combination thereof. In one embodiment, to achieve this reduced mode of power consumption, the battery management module 105 displays less battery intensive content in place of the more power consuming user interfaces traditionally used for route navigation (e.g., dynamic three-dimensional maps with full voice guidance). As previously described, the content may include offers, sponsored content, and/or other promotional materials related to the navigation route and/or points of interest near or on the route. Other examples of alternative content include voice or visual guides of the destination and/or any other points of interest along the route. For example, guides can be presented to provide additional information about famous places to visit, facts about the scenery along the route, etc. For example, if contextual information is available to indicate that the route is a vacation route and that this is the user's first visit to the area, content tailored this context can be presented.

In step 509, the battery management module 105 causes, at least in part, a recalculation of the battery charging information based, at least in part, on the designation of the one or more selected segments. In one embodiment, the battery management module 105 can dynamically update the charging information as new segments are selected or deselected for hibernation. The updated charging information is then presented to the user. In one embodiment, the battery charging information can also be updated as the route navigation progresses to reflect actual power consumption and travel times. In another embodiment, the estimated versus actual power consumption information can be processed to improve the processes and/or algorithms used by the battery management module 105 to calculate the battery charging information.

Figure 6:
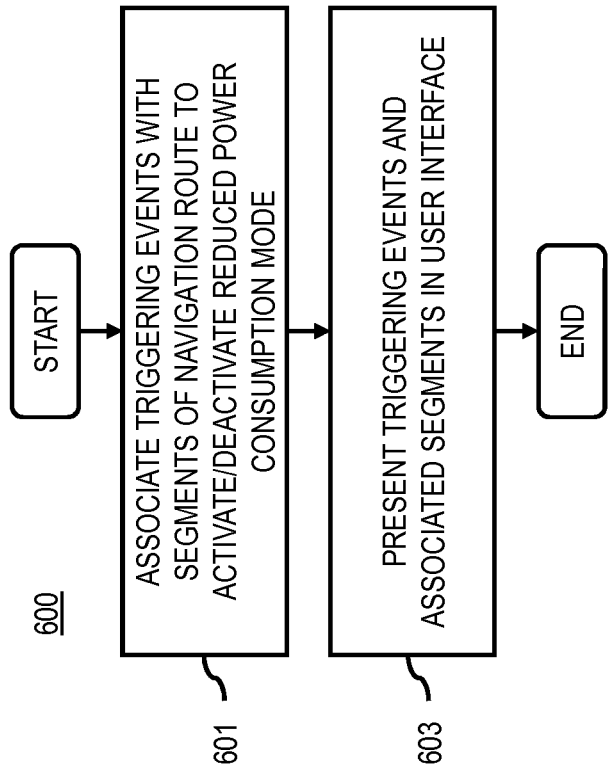
FIG. 6 is a flowchart of a process for associating triggering events for providing battery management in route navigation, according to one embodiment.

FIG. 6 is a flowchart of a process for associating triggering events for providing battery management in route navigation, according to one embodiment. In one embodiment, the battery management module 105 performs the process 600 and is implemented in, for instance, a chip set including a processor and a memory as shown in FIG. 10. In addition or alternatively, the battery management platform module 107 may perform all or a portion of the process 600, and may also be implemented in the chip set including the processor and the memory as shown in FIG. 10.

In step 601, the battery management platform 105 causes, at least in part, an association of one or more triggering events with the one or more available segments, the one or more selected segments, or a combination thereof. In one embodiment, the one or more triggering events cause, at least in part, the activation or a deactivation of the at least one reduced power consumption mode of operation, one or more actions, or a combination thereof while traveling the one or more available segments, the one or more selected segments, or a combination thereof. As previously discussed the triggering events and/or associated triggering locations/points in the segment facilitate transitioning the navigation application 103 from a hibernated mode of operation to an active mode.

In one embodiment, the battery management platform 105 enables an automated or user query for candidate triggering events. For example, the triggering events can be associated with points of interest, location beacons, toll stations, and/or any other feature detectable by the UE 101, the navigation application 103, and/or the battery management module 105 while route navigation is operating in a hibernated state or reduced power consumption mode where location-tracking is not performed or does not use more accurate (but more power hungry) mechanisms.

In step 603, the battery management platform 105 causes, at least in part, a presentation of the one or more triggering events, the one or more selected segments, the one or more available segments, or a combination thereof in the at least one user interface, in at least one other user interface associated with the at least one navigation route, or a combination thereof. In one embodiment, the one or more selected segments are differentiated from the one or more available segments in the at least one user interface, the at least one other user interface, or a combination thereof. For example, active segments can be rendered so that they are distinguished from hibernated segments using different rendering characteristics (e.g., color, line weights, graphics, etc.).

Figure 7:
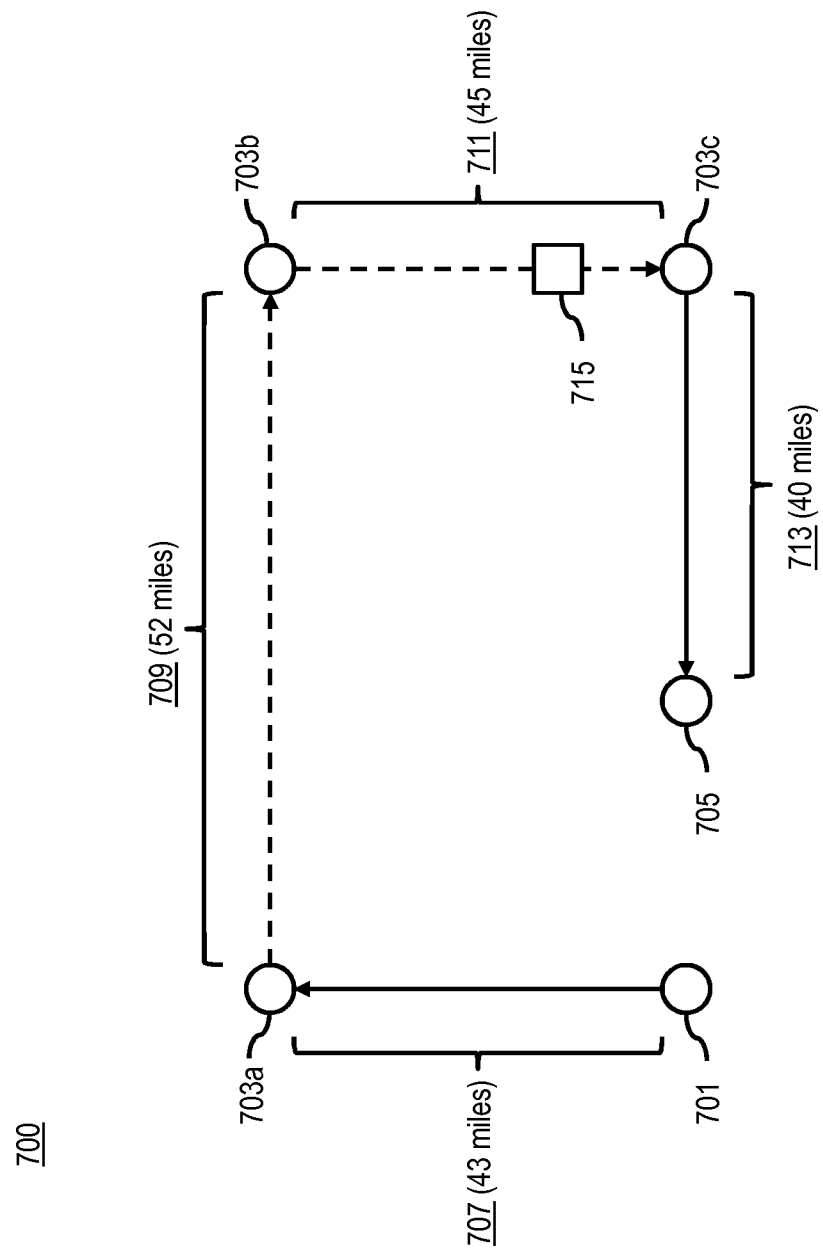
FIG. 7 is a diagram illustrating an example of a triggering event for providing battery management in route navigation, according to one embodiment.

FIG. 7 is a diagram illustrating an example of a triggering event for providing battery management in route navigation, according to one embodiment. The example of FIG. 7 depicts a navigation route 700 with a starting point 701, waypoints 703a-703c, and a destination 705. the navigation route 700 is further broken into a segment 707 from starting point 701 to waypoint 703a that is 43 miles long, a segment 709 from waypoint 703a to waypoint 703b that is 52 miles long, a segment 711 from waypoint 703b to waypoint 703c that is 45 miles long, and a segment 713 from waypoint 703c to destination 705 that is 40 miles long.

In this example, the battery management module 105 has designated segments 707 and 713 for active navigation (as indicated by the solid lines) and designated segments 709 and 711 for hibernation (as indicated by the dashed lines). In addition, on calculation of the navigation route 700, the battery management module 105 takes an odometer reading of the associated vehicle (e.g., 12345 miles) and notes the estimated time to leave (e.g., 8:30 AM).

Because the segments 709 and 711 are hibernated, the battery management module 105 also designates a triggering event 715 at a point near the end of the last hibernated segment 711 to trigger a return to active navigation for the last segment 713. To designate the triggering event 715, the battery management module 105, for instance, queries for well-known point of interest in segment 711 (e.g., a landmark) and specifies arrival at the landmark as the triggering event 715.

The battery management module 105 then computes an estimated odometer reading (e.g., 12480) and time of arrival (e.g., 10:20 AM) at the location of the triggering event 711 based on the length of the segments and/or distance from the starting point the triggering event 715 and a predicted speed of the traveling vehicle (or other mode of transport). In one embodiment, the triggering event 715 is also selected so that it is close to the waypoint 703c (e.g., at odometer reading 12485 with an estimated time of arrival at 10:35 AM) which marks the point where active navigation is to resume for segment 713.

In one embodiment, arrival at the location of the triggering event 715 (e.g., the triggering point) can be determined by input from the user or based on non-location satellite based approaches that are more power efficient (e.g., cell-ID, WiFi) to determine when the user has reached the estimated odometer reading (e.g., 12480) corresponding to the triggering event 715. In addition or alternatively, the estimated time of arrival (10:20 AM) at the triggering event 715 can also be used to determine arrival at the triggering event 715 location. On determination of the fulfilment of the triggering event 715, the battery management module 105 initiates a return to active navigation mode.

Figure 8A:
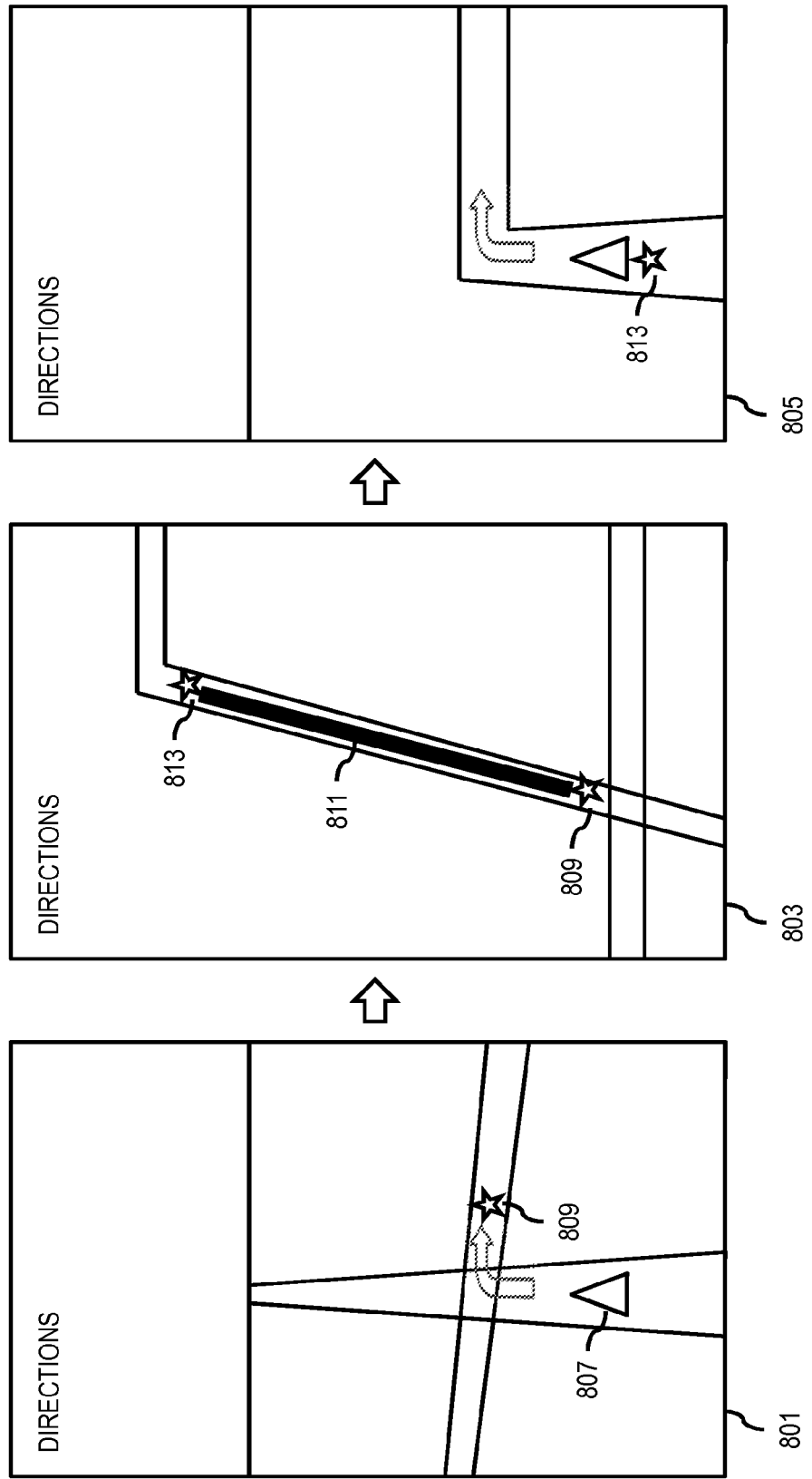
FIG. 8A shows user interface diagrams depicting a process for providing battery management in route navigation, according to various embodiments.

FIG. 8A shows user interface diagrams depicting a process for providing battery management in route navigation, according to various embodiments. More specifically, FIG. 8 illustrates how the battery management module 105 can cause the transition from an active mode navigation user interface 801 to a hibernated navigation user interface 803, and back to an active mode navigation user interface 805 for a navigation route using the various embodiments described herein for providing battery management.

The active mode navigation user interface 801 is an example of a normal navigation screen that uses full GPS sensors to provide a high frame rate mapping display rendered in three-dimensions using full computational resources that provide computations to support the display. In this mode, the power consumption rate is generally high. The user interface 801 shows that the user vehicle 807 is approaching a triggering event 809 that marks the beginning of a route segment that has been designated for hibernation.

On reaching the triggering event 809 (marking the vehicle's entry into the hibernated segment), the battery management module 105 initiates a reduced power consumption mode of operation for the navigation application 103 presenting the user interfaces 801-805. As shown, the user interface 801 transitions to the hibernated navigation user interface 803 which depicts a static display of an overview of the navigation route. In this mode, the battery management module 105 has deactivated satellite-based location sensors. Accordingly, the user interface 803 does not show or represent a current location of the user's vehicle. Instead, the user interface 803 shows the triggering event 809 that marks the beginning of the hibernated segment 811 (e.g., shown in a heavy dark line). The triggering event 813 marks the point where active navigation is to resume.

Using the various approaches described in the embodiments above, the battery management module 105 monitors when the user reaches the triggering event 813 (e.g., an odometer or time of arrival based-approach). When the location of the triggering event 813 is reached, the battery management module 105 initiates a transition to the active navigation user interface 805 for return to full active navigation (e.g., three-dimensional display with full GPS sensors).

Figure 8B:
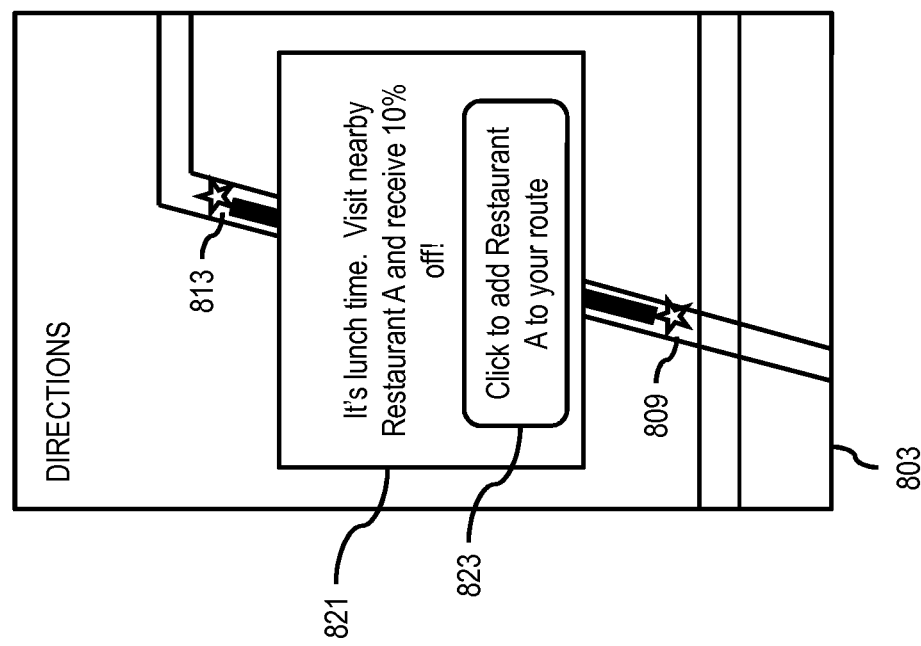
FIG. 8B depicts an example user interface for presenting alternative content during hibernated route segments, according to one embodiment.

FIG. 8B depicts an example user interface for presenting alternative content during hibernated route segments, according to one embodiment. As shown, FIG. 8B depicts a version of the hibernated user interface 803 of FIG. 8A that includes a pop-up window that provides less battery intensive content in place of the active navigation screens of, e.g., user interfaces 801 and 805. In this example, the battery management module 105 determines a location (user's position along the route) and time of day (e.g., noon time) to recommend a Restaurant A along the route and present related offer information (e.g., 10% off lunch). In one embodiment, the pop-up window also includes an option 823 to add the Restaurant A as a waypoint on the route. In this way, the battery management module 105 can present potentially relevant (but less battery intensive) information to the user during hibernated route segments.

The processes described herein for providing battery management in route navigation may be advantageously implemented via software, hardware, firmware or a combination of software and/or firmware and/or hardware. For example, the processes described herein, may be advantageously implemented via processor(s), Digital Signal Processing (DSP) chip, an Application Specific Integrated Circuit (ASIC), Field Programmable Gate Arrays (FPGAs), etc. Such exemplary hardware for performing the described functions is detailed below.

Figure 9:
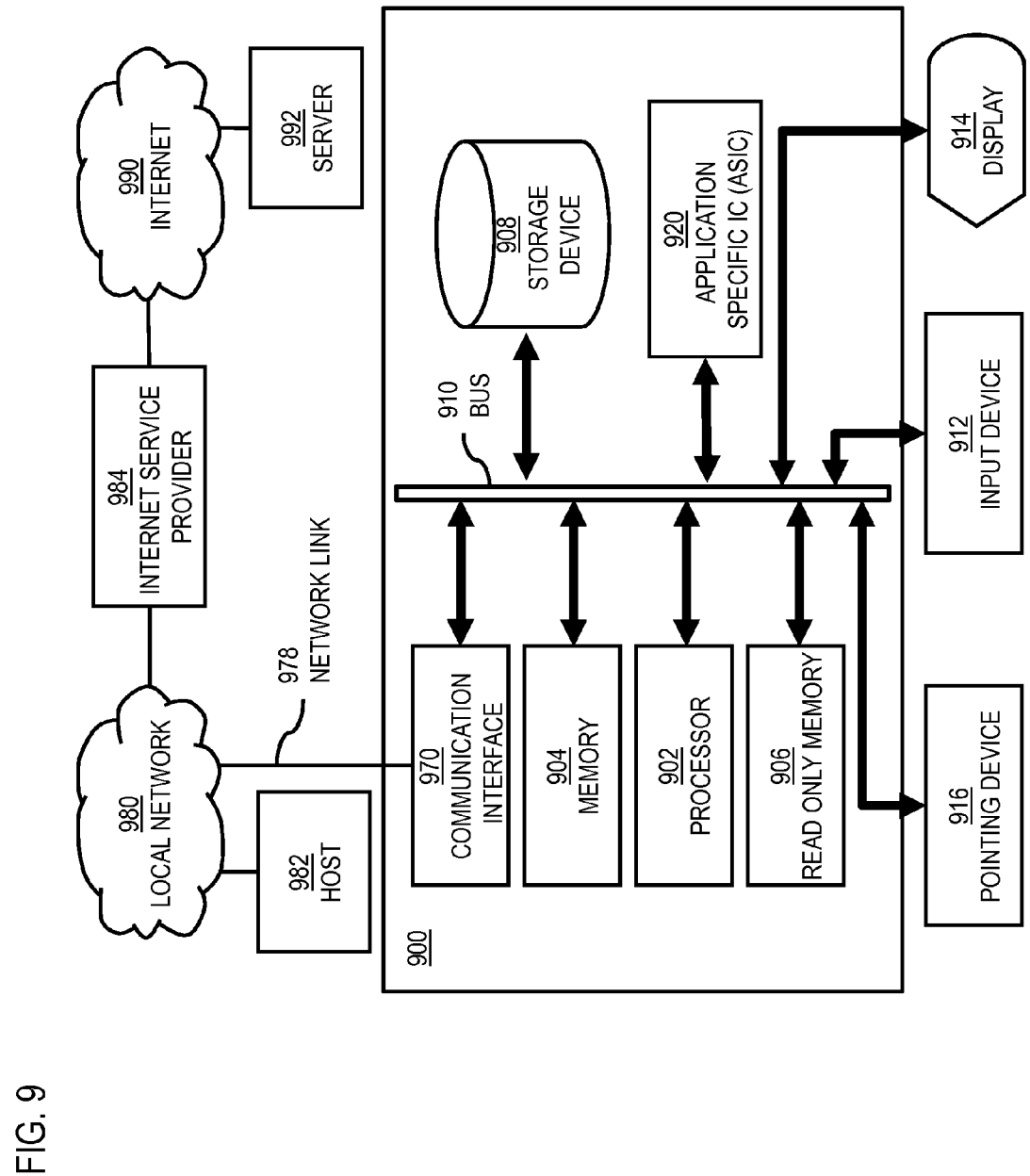
FIG. 9 is a diagram of hardware that can be used to implement an embodiment of the invention.

FIG. 9 illustrates a computer system 900 upon which an embodiment of the invention may be implemented. Although computer system 900 is depicted with respect to a particular device or equipment, it is contemplated that other devices or equipment (e.g., network elements, servers, etc.) within FIG. 9 can deploy the illustrated hardware and components of system 900. Computer system 900 is programmed (e.g., via computer program code or instructions) to provide battery management in route navigation as described herein and includes a communication mechanism such as a bus 910 for passing information between other internal and external components of the computer system 900. Information (also called data) is represented as a physical expression of a measurable phenomenon, typically electric voltages, but including, in other embodiments, such phenomena as magnetic, electromagnetic, pressure, chemical, biological, molecular, atomic, sub-atomic and quantum interactions. For example, north and south magnetic fields, or a zero and non-zero electric voltage, represent two states (0, 1) of a binary digit (bit). Other phenomena can represent digits of a higher base. A superposition of multiple simultaneous quantum states before measurement represents a quantum bit (qubit). A sequence of one or more digits constitutes digital data that is used to represent a number or code for a character. In some embodiments, information called analog data is represented by a near continuum of measurable values within a particular range. Computer system 900, or a portion thereof, constitutes a means for performing one or more steps of providing battery management in route navigation.

A bus 910 includes one or more parallel conductors of information so that information is transferred quickly among devices coupled to the bus 910. One or more processors 902 for processing information are coupled with the bus 910.

A processor (or multiple processors) 902 performs a set of operations on information as specified by computer program code related to providing battery management in route navigation. The computer program code is a set of instructions or statements providing instructions for the operation of the processor and/or the computer system to perform specified functions. The code, for example, may be written in a computer programming language that is compiled into a native instruction set of the processor. The code may also be written directly using the native instruction set (e.g., machine language). The set of operations include bringing information in from the bus 910 and placing information on the bus 910. The set of operations also typically include comparing two or more units of information, shifting positions of units of information, and combining two or more units of information, such as by addition or multiplication or logical operations like OR, exclusive OR (XOR), and AND. Each operation of the set of operations that can be performed by the processor is represented to the processor by information called instructions, such as an operation code of one or more digits. A sequence of operations to be executed by the processor 902, such as a sequence of operation codes, constitute processor instructions, also called computer system instructions or, simply, computer instructions. Processors may be implemented as mechanical, electrical, magnetic, optical, chemical or quantum components, among others, alone or in combination.

Computer system 900 also includes a memory 904 coupled to bus 910. The memory 904, such as a random access memory (RAM) or any other dynamic storage device, stores information including processor instructions for providing battery management in route navigation. Dynamic memory allows information stored therein to be changed by the computer system 900. RAM allows a unit of information stored at a location called a memory address to be stored and retrieved independently of information at neighboring addresses. The memory 904 is also used by the processor 902 to store temporary values during execution of processor instructions. The computer system 900 also includes a read only memory (ROM) 906 or any other static storage device coupled to the bus 910 for storing static information, including instructions, that is not changed by the computer system 900. Some memory is composed of volatile storage that loses the information stored thereon when power is lost. Also coupled to bus 910 is a non-volatile (persistent) storage device 908, such as a magnetic disk, optical disk or flash card, for storing information, including instructions, that persists even when the computer system 900 is turned off or otherwise loses power.

Information, including instructions for providing battery management in route navigation, is provided to the bus 910 for use by the processor from an external input device 912, such as a keyboard containing alphanumeric keys operated by a human user, or a sensor. A sensor detects conditions in its vicinity and transforms those detections into physical expression compatible with the measurable phenomenon used to represent information in computer system 900. Other external devices coupled to bus 910, used primarily for interacting with humans, include a display device 914, such as a cathode ray tube (CRT), a liquid crystal display (LCD), a light emitting diode (LED) display, an organic LED (OLED) display, a plasma screen, or a printer for presenting text or images, and a pointing device 916, such as a mouse, a trackball, cursor direction keys, or a motion sensor, for controlling a position of a small cursor image presented on the display 914 and issuing commands associated with graphical elements presented on the display 914. In some embodiments, for example, in embodiments in which the computer system 900 performs all functions automatically without human input, one or more of external input device 912, display device 914 and pointing device 916 is omitted.

In the illustrated embodiment, special purpose hardware, such as an application specific integrated circuit (ASIC) 920, is coupled to bus 910. The special purpose hardware is configured to perform operations not performed by processor 902 quickly enough for special purposes. Examples of ASICs include graphics accelerator cards for generating images for display 914, cryptographic boards for encrypting and decrypting messages sent over a network, speech recognition, and interfaces to special external devices, such as robotic arms and medical scanning equipment that repeatedly perform some complex sequence of operations that are more efficiently implemented in hardware.

Computer system 900 also includes one or more instances of a communications interface 970 coupled to bus 910. Communication interface 970 provides a one-way or two-way communication coupling to a variety of external devices that operate with their own processors, such as printers, scanners and external disks. In general the coupling is with a network link 978 that is connected to a local network 980 to which a variety of external devices with their own processors are connected. For example, communication interface 970 may be a parallel port or a serial port or a universal serial bus (USB) port on a personal computer. In some embodiments, communications interface 970 is an integrated services digital network (ISDN) card or a digital subscriber line (DSL) card or a telephone modem that provides an information communication connection to a corresponding type of telephone line. In some embodiments, a communication interface 970 is a cable modem that converts signals on bus 910 into signals for a communication connection over a coaxial cable or into optical signals for a communication connection over a fiber optic cable. As another example, communications interface 970 may be a local area network (LAN) card to provide a data communication connection to a compatible LAN, such as Ethernet. Wireless links may also be implemented. For wireless links, the communications interface 970 sends or receives or both sends and receives electrical, acoustic or electromagnetic signals, including infrared and optical signals, that carry information streams, such as digital data. For example, in wireless handheld devices, such as mobile telephones like cell phones, the communications interface 970 includes a radio band electromagnetic transmitter and receiver called a radio transceiver. In certain embodiments, the communications interface 970 enables connection to the communication network 109 for providing battery management in route navigation to the UE 101.

The term "computer-readable medium" as used herein refers to any medium that participates in providing information to processor 902, including instructions for execution. Such a medium may take many forms, including, but not limited to computer-readable storage medium (e.g., non-volatile media, volatile media), and transmission media. Non-transitory media, such as non-volatile media, include, for example, optical or magnetic disks, such as storage device 908. Volatile media include, for example, dynamic memory 904. Transmission media include, for example, twisted pair cables, coaxial cables, copper wire, fiber optic cables, and carrier waves that travel through space without wires or cables, such as acoustic waves and electromagnetic waves, including radio, optical and infrared waves. Signals include man-made transient variations in amplitude, frequency, phase, polarization or other physical properties transmitted through the transmission media. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, an EPROM, a FLASH-EPROM, an EEPROM, a flash memory, any other memory chip or cartridge, a carrier wave, or any other medium from which a computer can read. The term computer-readable storage medium is used herein to refer to any computer-readable medium except transmission media.

Logic encoded in one or more tangible media includes one or both of processor instructions on a computer-readable storage media and special purpose hardware, such as ASIC 920.

Network link 978 typically provides information communication using transmission media through one or more networks to other devices that use or process the information. For example, network link 978 may provide a connection through local network 980 to a host computer 982 or to equipment 984 operated by an Internet Service Provider (ISP). ISP equipment 984 in turn provides data communication services through the public, world-wide packet-switching communication network of networks now commonly referred to as the Internet 990.

A computer called a server host 992 connected to the Internet hosts a process that provides a service in response to information received over the Internet. For example, server host 992 hosts a process that provides information representing video data for presentation at display 914. It is contemplated that the components of system 900 can be deployed in various configurations within other computer systems, e.g., host 982 and server 992.

At least some embodiments of the invention are related to the use of computer system 900 for implementing some or all of the techniques described herein. According to one embodiment of the invention, those techniques are performed by computer system 900 in response to processor 902 executing one or more sequences of one or more processor instructions contained in memory 904. Such instructions, also called computer instructions, software and program code, may be read into memory 904 from another computer-readable medium such as storage device 908 or network link 978. Execution of the sequences of instructions contained in memory 904 causes processor 902 to perform one or more of the method steps described herein. In alternative embodiments, hardware, such as ASIC 920, may be used in place of or in combination with software to implement the invention. Thus, embodiments of the invention are not limited to any specific combination of hardware and software, unless otherwise explicitly stated herein.

The signals transmitted over network link 978 and other networks through communications interface 970, carry information to and from computer system 900. Computer system 900 can send and receive information, including program code, through the networks 980, 990 among others, through network link 978 and communications interface 970. In an example using the Internet 990, a server host 992 transmits program code for a particular application, requested by a message sent from computer 900, through Internet 990, ISP equipment 984, local network 980 and communications interface 970. The received code may be executed by processor 902 as it is received, or may be stored in memory 904 or in storage device 908 or any other non-volatile storage for later execution, or both. In this manner, computer system 900 may obtain application program code in the form of signals on a carrier wave.

Various forms of computer readable media may be involved in carrying one or more sequence of instructions or data or both to processor 902 for execution. For example, instructions and data may initially be carried on a magnetic disk of a remote computer such as host 982. The remote computer loads the instructions and data into its dynamic memory and sends the instructions and data over a telephone line using a modem. A modem local to the computer system 900 receives the instructions and data on a telephone line and uses an infra-red transmitter to convert the instructions and data to a signal on an infra-red carrier wave serving as the network link 978. An infrared detector serving as communications interface 970 receives the instructions and data carried in the infrared signal and places information representing the instructions and data onto bus 910. Bus 910 carries the information to memory 904 from which processor 902 retrieves and executes the instructions using some of the data sent with the instructions. The instructions and data received in memory 904 may optionally be stored on storage device 908, either before or after execution by the processor 902.

FIG. 10 illustrates a chip set or chip 1000 upon which an embodiment of the invention may be implemented. Chip set 1000 is programmed to provide battery management in route navigation as described herein and includes, for instance, the processor and memory components described with respect to FIG. 9 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set 1000 can be implemented in a single chip. It is further contemplated that in certain embodiments the chip set or chip 1000 can be implemented as a single "system on a chip." It is further contemplated that in certain embodiments a separate ASIC would not be used, for example, and that all relevant functions as disclosed herein would be performed by a processor or processors. Chip set or chip 1000, or a portion thereof, constitutes a means for performing one or more steps of providing user interface navigation information associated with the availability of functions. Chip set or chip 1000, or a portion thereof, constitutes a means for performing one or more steps of providing battery management in route navigation.

In one embodiment, the chip set or chip 1000 includes a communication mechanism such as a bus 1001 for passing information among the components of the chip set 1000. A processor 1003 has connectivity to the bus 1001 to execute instructions and process information stored in, for example, a memory 1005. The processor 1003 may include one or more processing cores with each core configured to perform independently. A multi-core processor enables multiprocessing within a single physical package. Examples of a multi-core processor include two, four, eight, or greater numbers of processing cores. Alternatively or in addition, the processor 1003 may include one or more microprocessors configured in tandem via the bus 1001 to enable independent execution of instructions, pipelining, and multithreading. The processor 1003 may also be accompanied with one or more specialized components to perform certain processing functions and tasks such as one or more digital signal processors (DSP) 1007, or one or more application-specific integrated circuits (ASIC) 1009. A DSP 1007 typically is configured to process real-world signals (e.g., sound) in real time independently of the processor 1003. Similarly, an ASIC 1009 can be configured to performed specialized functions not easily performed by a more general purpose processor. Other specialized components to aid in performing the inventive functions described herein may include one or more field programmable gate arrays (FPGA) (not shown), one or more controllers (not shown), or one or more other special-purpose computer chips.

In one embodiment, the chip set or chip 1000 includes merely one or more processors and some software and/or firmware supporting and/or relating to and/or for the one or more processors.

The processor 1003 and accompanying components have connectivity to the memory 1005 via the bus 1001. The memory 1005 includes both dynamic memory (e.g., RAM, magnetic disk, writable optical disk, etc.) and static memory (e.g., ROM, CD-ROM, etc.) for storing executable instructions that when executed perform the inventive steps described herein to provide battery management in route navigation. The memory 1005 also stores the data associated with or generated by the execution of the inventive steps.

Figure 11:
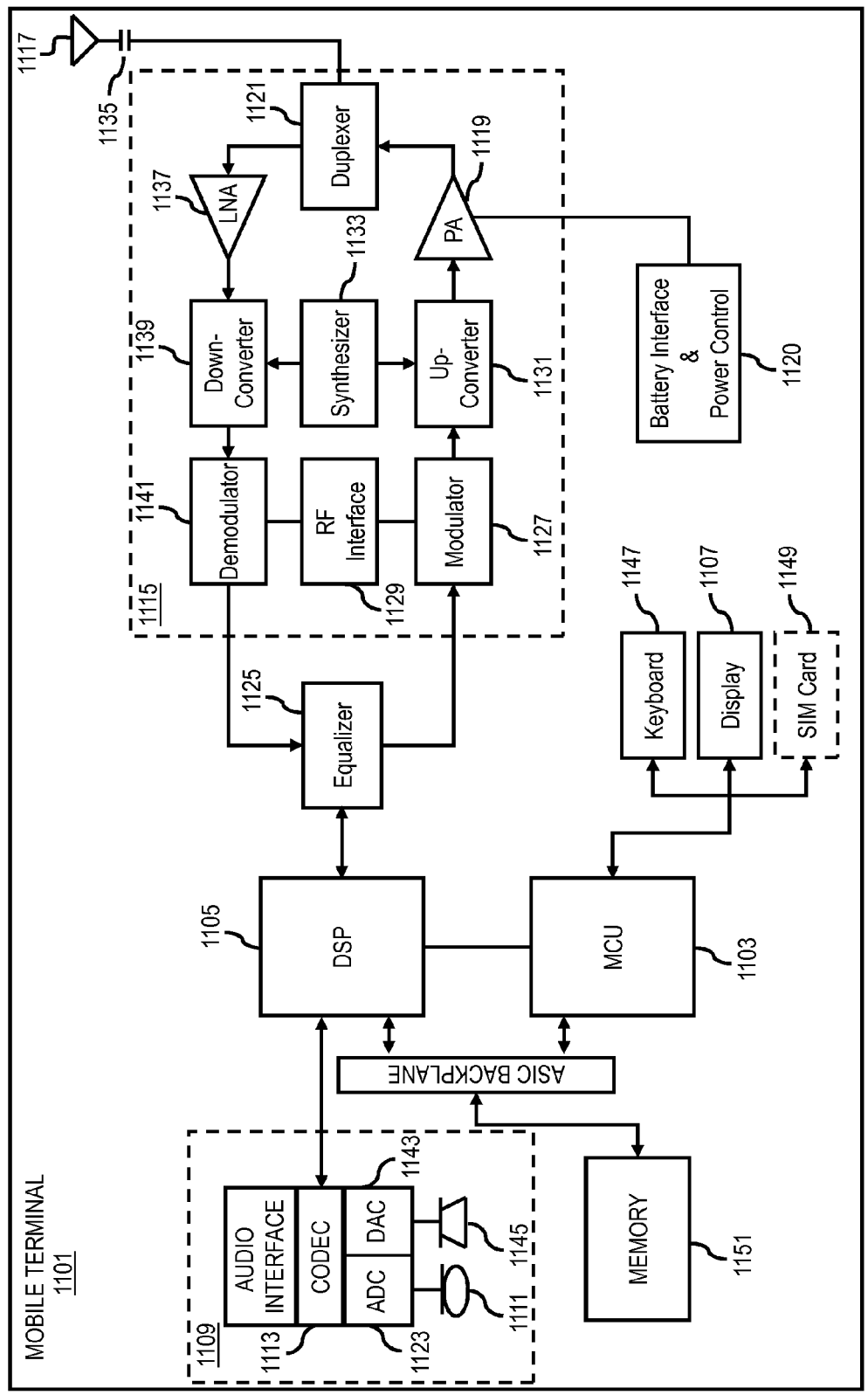
FIG. 11 is a diagram of a mobile terminal (e.g., handset) that can be used to implement an embodiment of the invention.

FIG. 11 is a diagram of exemplary components of a mobile terminal (e.g., handset) for communications, which is capable of operating in the system of FIG. 1, according to one embodiment. In some embodiments, mobile terminal 1101, or a portion thereof, constitutes a means for performing one or more steps of providing battery management in route navigation. Generally, a radio receiver is often defined in terms of front-end and back-end characteristics. The front-end of the receiver encompasses all of the Radio Frequency (RF) circuitry whereas the back-end encompasses all of the base-band processing circuitry. As used in this application, the term "circuitry" refers to both: (1) hardware-only implementations (such as implementations in only analog and/or digital circuitry), and (2) to combinations of circuitry and software (and/or firmware) (such as, if applicable to the particular context, to a combination of processor(s), including digital signal processor(s), software, and memory(ies) that work together to cause an apparatus, such as a mobile phone or server, to perform various functions). This definition of "circuitry" applies to all uses of this term in this application, including in any claims. As a further example, as used in this application and if applicable to the particular context, the term "circuitry" would also cover an implementation of merely a processor (or multiple processors) and its (or their) accompanying software/or firmware. The term "circuitry" would also cover if applicable to the particular context, for example, a baseband integrated circuit or applications processor integrated circuit in a mobile phone or a similar integrated circuit in a cellular network device or other network devices.

Pertinent internal components of the telephone include a Main Control Unit (MCU) 1103, a Digital Signal Processor (DSP) 1105, and a receiver/transmitter unit including a microphone gain control unit and a speaker gain control unit. A main display unit 1107 provides a display to the user in support of various applications and mobile terminal functions that perform or support the steps of providing battery management in route navigation. The display 1107 includes display circuitry configured to display at least a portion of a user interface of the mobile terminal (e.g., mobile telephone). Additionally, the display 1107 and display circuitry are configured to facilitate user control of at least some functions of the mobile terminal. An audio function circuitry 1109 includes a microphone 1111 and microphone amplifier that amplifies the speech signal output from the microphone 1111. The amplified speech signal output from the microphone 1111 is fed to a coder/decoder (CODEC) 1113.

A radio section 1115 amplifies power and converts frequency in order to communicate with a base station, which is included in a mobile communication system, via antenna 1117. The power amplifier (PA) 1119 and the transmitter/modulation circuitry are operationally responsive to the MCU 1103, with an output from the PA 1119 coupled to the duplexer 1121 or circulator or antenna switch, as known in the art. The PA 1119 also couples to a battery interface and power control unit 1120.

In use, a user of mobile terminal 1101 speaks into the microphone 1111 and his or her voice along with any detected background noise is converted into an analog voltage. The analog voltage is then converted into a digital signal through the Analog to Digital Converter (ADC) 1123. The control unit 1103 routes the digital signal into the DSP 1105 for processing therein, such as speech encoding, channel encoding, encrypting, and interleaving. In one embodiment, the processed voice signals are encoded, by units not separately shown, using a cellular transmission protocol such as enhanced data rates for global evolution (EDGE), general packet radio service (GPRS), global system for mobile communications (GSM), Internet protocol multimedia subsystem (IMS), universal mobile telecommunications system (UMTS), etc., as well as any other suitable wireless medium, e.g., microwave access (WiMAX), Long Term Evolution (LTE) networks, code division multiple access (CDMA), wideband code division multiple access (WCDMA), wireless fidelity (WiFi), satellite, and the like, or any combination thereof.

The encoded signals are then routed to an equalizer 1125 for compensation of any frequency-dependent impairments that occur during transmission though the air such as phase and amplitude distortion. After equalizing the bit stream, the modulator 1127 combines the signal with a RF signal generated in the RF interface 1129. The modulator 1127 generates a sine wave by way of frequency or phase modulation. In order to prepare the signal for transmission, an up-converter 1131 combines the sine wave output from the modulator 1127 with another sine wave generated by a synthesizer 1133 to achieve the desired frequency of transmission. The signal is then sent through a PA 1119 to increase the signal to an appropriate power level. In practical systems, the PA 1119 acts as a variable gain amplifier whose gain is controlled by the DSP 1105 from information received from a network base station. The signal is then filtered within the duplexer 1121 and optionally sent to an antenna coupler 1135 to match impedances to provide maximum power transfer. Finally, the signal is transmitted via antenna 1117 to a local base station. An automatic gain control (AGC) can be supplied to control the gain of the final stages of the receiver. The signals may be forwarded from there to a remote telephone which may be another cellular telephone, any other mobile phone or a land-line connected to a Public Switched Telephone Network (PSTN), or other telephony networks.

Voice signals transmitted to the mobile terminal 1101 are received via antenna 1117 and immediately amplified by a low noise amplifier (LNA) 1137. A down-converter 1139 lowers the carrier frequency while the demodulator 1141 strips away the RF leaving only a digital bit stream. The signal then goes through the equalizer 1125 and is processed by the DSP 1105. A Digital to Analog Converter (DAC) 1143 converts the signal and the resulting output is transmitted to the user through the speaker 1145, all under control of a Main Control Unit (MCU) 1103 which can be implemented as a Central Processing Unit (CPU) (not shown).

The MCU 1103 receives various signals including input signals from the keyboard 1147. The keyboard 1147 and/or the MCU 1103 in combination with other user input components (e.g., the microphone 1111) comprise a user interface circuitry for managing user input. The MCU 1103 runs a user interface software to facilitate user control of at least some functions of the mobile terminal 1101 to provide battery management in route navigation. The MCU 1103 also delivers a display command and a switch command to the display 1107 and to the speech output switching controller, respectively. Further, the MCU 1103 exchanges information with the DSP 1105 and can access an optionally incorporated SIM card 1149 and a memory 1151. In addition, the MCU 1103 executes various control functions required of the terminal. The DSP 1105 may, depending upon the implementation, perform any of a variety of conventional digital processing functions on the voice signals. Additionally, DSP 1105 determines the background noise level of the local environment from the signals detected by microphone 1111 and sets the gain of microphone 1111 to a level selected to compensate for the natural tendency of the user of the mobile terminal 1101.

The CODEC 1113 includes the ADC 1123 and DAC 1143. The memory 1151 stores various data including call incoming tone data and is capable of storing other data including music data received via, e.g., the global Internet. The software module could reside in RAM memory, flash memory, registers, or any other form of writable storage medium known in the art. The memory device 1151 may be, but not limited to, a single memory, CD, DVD, ROM, RAM, EEPROM, optical storage, magnetic disk storage, flash memory storage, or any other non-volatile storage medium capable of storing digital data.

An optionally incorporated SIM card 1149 carries, for instance, important information, such as the cellular phone number, the carrier supplying service, subscription details, and security information. The SIM card 1149 serves primarily to identify the mobile terminal 1101 on a radio network. The card 1149 also contains a memory for storing a personal telephone number registry, text messages, and user specific mobile terminal settings.

While the invention has been described in connection with a number of embodiments and implementations, the invention is not so limited but covers various obvious modifications and equivalent arrangements, which fall within the purview of the appended claims. Although features of the invention are expressed in certain combinations among the claims, it is contemplated that these features can be arranged in any combination and order.

What is claimed is:

1. A method comprising:
    initiating, by an apparatus, a calculation of at least one navigation route of a vehicle;
    determining, by the apparatus, battery charging information associated with presenting guidance information via at least one application of a mobile device within the vehicle during traveling along the at least one navigation route, wherein the mobile device is powered by one or more batteries independent from a power system of the vehicle; and
    initiating, by the apparatus, an activation of at least one reduced power consumption mode of operation of the mobile device based, at least in part, on the battery charging information.

2. A method of claim 1, further comprising:
    initiating a presentation of the battery charging information on at least one user interface of the mobile device, wherein the battery charging information includes, at least in part, an estimated number of charging cycles for one or more batteries of the mobile device, and wherein the apparatus is embedded in the mobile device, a network node connecting to the mobile device via a network, or a combination thereof.

3. A method of claim 1, further comprising:
    determining one or more selected segments of the at least one navigation route;
    initiating a designation of the one or more selected segments for the activation of the at least one reduced power consumption mode of operation of the mobile device while traveling the one or more selected segments; and
    initiating a recalculation of the battery charging information based, at least in part, on the designation of the one or more selected segments.

4. A method of claim 3, further comprising:
    initiating a presentation of one or more available segments of the at least one navigation route on the mobile device; and
    receiving at least one input for selecting the one or more selected segments from the one or more available segments.

5. A method of claim 3, further comprising:
    initiating a presentation of a recommendation of the one or more selected segments on the mobile device based, at least in part, on preference information, historical information, contextual information, or a combination thereof.

6. A method of claim 4, further comprising:
determining an association of one or more triggering events with the one or more available segments, the one or more selected segments, or a combination thereof,
wherein the one or more triggering events cause, at least in part, the activation or a deactivation of the at least one reduced power consumption mode of operation, one or more actions, or a combination thereof while traveling the one or more available segments, the one or more selected segments, or a combination thereof.

7. A method of claim 6, further comprising:
initiating a presentation of the one or more triggering events, the one or more selected segments, the one or more available segments, or a combination thereof in at least one user interface, in at least one other user interface on the mobile device associated with the at least one navigation route, or a combination thereof,
wherein the one or more selected segments are differentiated from the one or more available segments in the at least one user interface, the at least one other user interface, or a combination thereof.

8. A method of claim 3, further comprising:
initiating an activation of at least one reduced power consumption mode of operation of the at least one application based, at least in part, on the battery charging information,
wherein the at least one reduced power consumption mode of the mobile device includes a disabling of one or more sensors of the mobile device, a use of one or more alternate sensors of the mobile device, or a combination thereof, and wherein the at least one reduced power consumption mode of the at least one application includes a disabling of one or more rendering options on the mobile device, a reduction in computational resources of the mobile device, or a combination thereof.

9. A method of claim 1, further comprising:
determining one or more modes of transport associated with the at least one navigation route, wherein the battery charging information is further based, at least in part, on the one or more modes of transport.

10. A method of claim 1, further comprising:
determining one or more alternate navigation routes based, at least in part, on the battery charging information.

11. An apparatus comprising:
at least one processor; and
at least one memory including computer program code for one or more programs,
the at least one memory and the computer program code configured to, with the at least one processor, cause the apparatus to perform at least the following,
initiate a calculation of at least one navigation route of a vehicle;
determine battery charging information associated with presenting guidance information via at least one application of a mobile device within the vehicle during traveling along the at least one navigation route, wherein the mobile device is powered by one or more batteries independent from a power system of the vehicle; and
initiate an activation of at least one reduced power consumption mode of operation of the mobile device based, at least in part, on the battery charging information.

12. An apparatus of claim 11, wherein the apparatus is further caused to:
initiate a presentation of the battery charging information on at least one user interface of the mobile device,
wherein the battery charging information includes, at least part, an estimated number of charging cycles for one or more batteries of the mobile device.

13. An apparatus of claim 11, wherein the apparatus is further caused to:
determine one or more selected segments of the at least one navigation route;
initiate a designation of the one or more selected segments for the activation of the at least one reduced power consumption mode of operation of the mobile device while traveling the one or more selected segments; and
initiate a recalculation of the battery charging information based, at least in part, on the designation of the one or more selected segments.

14. An apparatus of claim 13, wherein the apparatus is further caused to:
initiate a presentation of one or more available segments of the at least one navigation route on the mobile device; and
receive at least one input for selecting the one or more selected segments from the one or more available segments.

15. An apparatus of claim 13, wherein the apparatus is further caused to:
initiate a presentation of a recommendation of the one or more selected segments on the mobile device based, at least in part, on preference information, historical information, contextual information, or a combination thereof.

16. An apparatus of claim 14, wherein the apparatus is further caused to:
determine an association of one or more triggering events with the one or more available segments, the one or more selected segments, or a combination thereof, wherein the one or more triggering events cause, at least in part, the activation or a deactivation of the at least one reduced power consumption mode of operation, one or more actions, or a combination thereof while traveling the one or more available segments, the one or more selected segments, or a combination thereof.

17. An apparatus of claim 11, wherein the apparatus is further caused to:
determine one or more modes of transport associated with the at least one navigation route, wherein the battery charging information is further based, at least in part, on the one or more modes of transport.

18. A non-transitory computer-readable storage medium carrying one or more sequences of one or more instructions which, when executed by one or more processors, cause an apparatus to perform:
initiating a calculation of at least one navigation route of a vehicle;
determining battery charging information associated with presenting guidance information via at least one application of a mobile device within the vehicle during traveling along the at least one navigation route, wherein the mobile device is powered by one or more batteries independent from a power system of the vehicle; and
initiating an activation of at least one reduced power consumption mode of operation of the mobile device based, at least in part, on the battery charging information.

19. A non-transitory computer-readable storage medium of claim 18, wherein the apparatus is further caused to perform:
   initiating a presentation of the battery charging information on at least one user interface of the mobile device,
   wherein the battery charging information includes, at least in part, an estimated number of charging cycles for one or more batteries of the mobile device.

20. A non-transitory computer-readable storage medium of claim 18, wherein the apparatus is further caused to perform:
   determining one or more selected segments of the at least one navigation route;
   initiating a designation of the one or more selected segments for the activation of the at least one reduced power consumption mode of operation of the mobile device while traveling the one or more selected segments; and
   initiating a recalculation of the battery charging information based, at least in part, on the designation of the one or more selected segments.

\* \* \* \* \*